United States Patent
Sakai et al.

(10) Patent No.: US 9,166,739 B2
(45) Date of Patent: Oct. 20, 2015

(54) ERROR CORRECTION PROCESSING CIRCUIT AND ERROR CORRECTION PROCESSING METHOD

(75) Inventors: Toshiharu Sakai, Suita (JP); Ryoji Azumi, Sakai (JP); Kiyomasa Nishisaka, Sanda (JP); Daisuke Hirata, Ibaraki (JP); Hiroyuki Kitajima, Oyama (JP)

(73) Assignee: FUJITSU LIMITED, Kawasaki (JP)

( * ) Notice: Subject to any disclaimer, the term of this patent is extended or adjusted under 35 U.S.C. 154(b) by 412 days.

(21) Appl. No.: 13/488,741

(22) Filed: Jun. 5, 2012

(65) Prior Publication Data

US 2012/0331364 A1    Dec. 27, 2012

(30) Foreign Application Priority Data

Jun. 24, 2011  (JP) ................................. 2011-140977

(51) Int. Cl.
| | |
|---|---|
| H04Q 11/04 | (2006.01) |
| G06F 11/07 | (2006.01) |
| H04L 15/00 | (2006.01) |
| H04L 1/00 | (2006.01) |
| H03M 13/15 | (2006.01) |
| H03M 13/00 | (2006.01) |

(52) U.S. Cl.
CPC ......... *H04L 1/0052* (2013.01); *H03M 13/1515* (2013.01); *H03M 13/6561* (2013.01)

(58) Field of Classification Search
CPC ............ H03M 13/6561; H03M 13/00; H03M 13/1515; H04N 7/17309; G11B 2020/1843; G11B 2020/1859; G11B 2020/1863; G11B 20/1833; H04L 1/0052; H04L 7/033; H04Q 11/0407; H04M 9/008

USPC .......... 714/E11.023, 746, 772, 769, 752, 807; 369/53.35; 341/67

See application file for complete search history.

(56) References Cited

U.S. PATENT DOCUMENTS

| | | | | | |
|---|---|---|---|---|---|
| 4,486,881 | A | * | 12/1984 | de Couasnon | ................. 714/758 |
| 5,404,248 | A | * | 4/1995 | Shimoda et al. | ................ 360/48 |
| 5,809,176 | A | * | 9/1998 | Yajima | .......................... 382/247 |
| 5,859,875 | A | * | 1/1999 | Kato et al. | ..................... 375/267 |
| 6,990,624 | B2 | * | 1/2006 | Dohmen et al. | .............. 714/785 |
| 7,475,325 | B2 | * | 1/2009 | Watanabe et al. | ............. 714/763 |
| 7,570,671 | B2 | * | 8/2009 | Perkins et al. | ................ 370/535 |

(Continued)

FOREIGN PATENT DOCUMENTS

| | | |
|---|---|---|
| EP | 1 545 011 A1 | 6/2005 |
| JP | 2010-34976 | 2/2010 |
| WO | WO 2008/035469 | 3/2008 |

OTHER PUBLICATIONS

Japanese Office Action issued Jan. 6, 2015 in corresponding Japanese Patent Application No. 2011-140977.

*Primary Examiner* — Phung M Chung
(74) *Attorney, Agent, or Firm* — Staas & Halsey LLP

(57) ABSTRACT

An error correction processing circuit, includes: a division circuit that divides input data into a plurality of pieces of a predetermined data length; a plurality of operation circuits that are provided in parallel, and that perform operations of error correction for the plurality of pieces of data divided by the division circuit, respectively; a multiplexing circuit that multiplexes the plurality of pieces of data for which the operations have been performed by the plurality of operation circuits; and an output circuit that outputs the data multiplexed by the multiplexing circuit.

6 Claims, 19 Drawing Sheets

(56) References Cited

U.S. PATENT DOCUMENTS 8,705,741 B2 * 4/2014 Voruganti et al. ............. 380/256
2002/0116679 A1 * 8/2002 Lei et al. ...................... 714/785
2009/0225914 A1 9/2009 Ide et al.
2012/0246507 A1 * 9/2012 Luo et al. ......................... 714/2

* cited by examiner

FIG. 5B $$\alpha^{120}\begin{pmatrix}1&0&0&1&1&1&0&0\\1&1&0&0&1&1&1&0\\0&1&1&0&0&1&1&1\\0&0&1&1&0&0&1&1\\1&0&0&0&0&1&0&1\\1&1&0&1&1&1&1&0\\0&1&1&1&0&0&1&1\\0&0&1&1&1&0&0&1\end{pmatrix} \quad \alpha^{169}\begin{pmatrix}1&1&1&1&0&1&1&1\\1&1&1&1&1&0&1&1\\1&1&1&1&1&1&0&1\\0&1&1&1&1&1&1&0\\0&1&0&0&1&0&0&0\\0&1&0&1&0&0&1&1\\1&1&0&1&1&1&1&0\\1&1&1&0&1&1&1&1\end{pmatrix}$$

$$\alpha^{3}\begin{pmatrix}0&0&0&1&0&0&0&0\\1&0&0&0&1&0&0&0\\1&1&0&0&0&1&0&0\\1&1&1&0&0&0&1&0\\0&1&1&0&0&0&0&1\\1&0&1&0&0&0&0&0\\0&1&0&0&0&0&0&0\\0&0&1&0&0&0&0&0\end{pmatrix} \quad \alpha^{109}\begin{pmatrix}1&0&0&0&1&1&0&1\\1&1&0&0&0&1&1&0\\1&1&1&0&0&0&1&1\\1&1&1&1&0&0&0&1\\1&1&1&1&0&1&0&1\\0&1&1&1&0&1&1&1\\0&0&1&1&0&1&1&0\\0&0&0&1&1&0&1&1\end{pmatrix}$$

$$\alpha^{225}\begin{pmatrix}1&1&1&0&0&1&0&0\\1&1&1&1&0&0&1&0\\1&1&1&1&1&0&0&1\\1&1&1&1&1&1&0&0\\1&0&0&1&1&0&1&0\\0&1&1&0&1&0&0&1\\1&0&0&1&0&0&0&0\\1&1&0&0&1&0&0&0\end{pmatrix} \quad \alpha^{147}\begin{pmatrix}0&1&0&1&0&1&0&0\\0&0&1&0&1&0&1&0\\1&0&0&1&0&1&0&1\\1&1&0&0&1&0&1&0\\1&0&1&1&0&0&0&1\\0&0&0&0&1&1&0&0\\0&1&0&1&0&0&1&0\\1&0&1&0&1&0&0&1\end{pmatrix}$$

FIG. 5C $$\alpha^{76}\begin{pmatrix}1 & 1 & 1 & 1 & 1 & 0 & 0 & 0\\ 0 & 1 & 1 & 1 & 1 & 1 & 0 & 0\\ 1 & 0 & 1 & 1 & 1 & 1 & 1 & 0\\ 1 & 1 & 0 & 1 & 1 & 1 & 1 & 1\\ 1 & 0 & 0 & 1 & 0 & 1 & 1 & 1\\ 0 & 0 & 1 & 1 & 0 & 0 & 1 & 1\\ 1 & 1 & 1 & 0 & 0 & 0 & 0 & 1\\ 1 & 1 & 1 & 1 & 0 & 0 & 0 & 0\end{pmatrix} \quad \alpha^{107}\begin{pmatrix}0 & 0 & 1 & 1 & 0 & 1 & 1 & 0\\ 0 & 0 & 0 & 1 & 1 & 0 & 1 & 1\\ 1 & 0 & 0 & 0 & 1 & 1 & 0 & 1\\ 1 & 1 & 0 & 0 & 0 & 1 & 1 & 0\\ 1 & 1 & 0 & 1 & 0 & 1 & 0 & 1\\ 1 & 1 & 0 & 1 & 1 & 1 & 0 & 0\\ 0 & 1 & 0 & 1 & 1 & 0 & 0 & 0\\ 0 & 0 & 1 & 0 & 1 & 1 & 0 & 0\end{pmatrix}$$

$$\alpha^{194}\begin{pmatrix}0 & 0 & 0 & 0 & 1 & 1 & 0 & 0\\ 0 & 0 & 0 & 0 & 0 & 1 & 1 & 0\\ 1 & 0 & 0 & 0 & 0 & 0 & 1 & 1\\ 1 & 1 & 0 & 0 & 0 & 0 & 0 & 1\\ 1 & 1 & 1 & 0 & 1 & 1 & 0 & 0\\ 0 & 1 & 1 & 1 & 1 & 0 & 1 & 0\\ 0 & 0 & 1 & 1 & 0 & 0 & 0 & 1\\ 0 & 0 & 0 & 1 & 1 & 0 & 0 & 0\end{pmatrix} \quad \alpha^{191}\begin{pmatrix}0 & 1 & 1 & 0 & 0 & 0 & 1 & 0\\ 0 & 0 & 1 & 1 & 0 & 0 & 0 & 1\\ 0 & 0 & 0 & 1 & 1 & 0 & 0 & 0\\ 0 & 0 & 0 & 0 & 1 & 1 & 0 & 0\\ 0 & 1 & 1 & 0 & 0 & 1 & 0 & 0\\ 1 & 1 & 0 & 1 & 0 & 0 & 0 & 0\\ 1 & 0 & 0 & 0 & 1 & 0 & 1 & 0\\ 1 & 1 & 0 & 0 & 0 & 1 & 0 & 1\end{pmatrix}$$

$$\alpha^{161}\begin{pmatrix}1 & 0 & 0 & 1 & 1 & 0 & 1 & 1\\ 1 & 1 & 0 & 0 & 1 & 1 & 0 & 1\\ 1 & 1 & 1 & 0 & 0 & 1 & 1 & 0\\ 1 & 1 & 1 & 1 & 0 & 0 & 1 & 1\\ 1 & 1 & 1 & 0 & 0 & 0 & 1 & 0\\ 1 & 1 & 1 & 0 & 1 & 0 & 1 & 0\\ 0 & 1 & 1 & 0 & 1 & 1 & 1 & 0\\ 0 & 0 & 1 & 1 & 0 & 1 & 1 & 1\end{pmatrix} \quad \alpha^{104}\begin{pmatrix}1 & 0 & 1 & 1 & 0 & 0 & 0 & 0\\ 1 & 1 & 0 & 1 & 1 & 0 & 0 & 0\\ 0 & 1 & 1 & 0 & 1 & 1 & 0 & 0\\ 0 & 0 & 1 & 1 & 0 & 1 & 1 & 0\\ 1 & 0 & 1 & 0 & 1 & 0 & 1 & 1\\ 1 & 1 & 1 & 0 & 0 & 1 & 0 & 1\\ 1 & 1 & 0 & 0 & 0 & 0 & 1 & 0\\ 0 & 1 & 1 & 0 & 0 & 0 & 0 & 1\end{pmatrix}$$

FIG. 5D $$\alpha^{182}\begin{pmatrix} 0 & 1 & 1 & 0 & 0 & 1 & 1 & 0 \\ 1 & 0 & 1 & 1 & 0 & 0 & 1 & 1 \\ 0 & 1 & 0 & 1 & 1 & 0 & 0 & 1 \\ 1 & 0 & 1 & 0 & 1 & 1 & 0 & 0 \\ 0 & 0 & 1 & 1 & 0 & 0 & 0 & 0 \\ 1 & 1 & 1 & 1 & 1 & 1 & 1 & 0 \\ 1 & 0 & 0 & 1 & 1 & 0 & 0 & 1 \\ 1 & 1 & 0 & 0 & 1 & 1 & 0 & 0 \end{pmatrix}$$

$$\alpha^{91}\begin{pmatrix} 0 & 1 & 1 & 1 & 0 & 1 & 0 & 1 \\ 1 & 0 & 1 & 1 & 1 & 0 & 1 & 0 \\ 0 & 1 & 0 & 1 & 1 & 1 & 0 & 1 \\ 0 & 0 & 1 & 0 & 1 & 1 & 1 & 0 \\ 0 & 1 & 1 & 0 & 0 & 0 & 1 & 0 \\ 0 & 1 & 0 & 0 & 0 & 1 & 0 & 0 \\ 1 & 1 & 0 & 1 & 0 & 1 & 1 & 1 \\ 1 & 1 & 1 & 0 & 1 & 0 & 1 & 1 \end{pmatrix}$$

$$\alpha^{102}\begin{pmatrix} 1 & 1 & 0 & 0 & 0 & 0 & 1 & 0 \\ 0 & 1 & 1 & 0 & 0 & 0 & 0 & 1 \\ 1 & 0 & 1 & 1 & 0 & 0 & 0 & 0 \\ 1 & 1 & 0 & 1 & 1 & 0 & 0 & 0 \\ 1 & 0 & 1 & 0 & 1 & 1 & 1 & 0 \\ 1 & 0 & 0 & 1 & 0 & 1 & 0 & 1 \\ 0 & 0 & 0 & 0 & 1 & 0 & 0 & 0 \\ 1 & 0 & 0 & 0 & 0 & 1 & 0 & 0 \end{pmatrix}$$

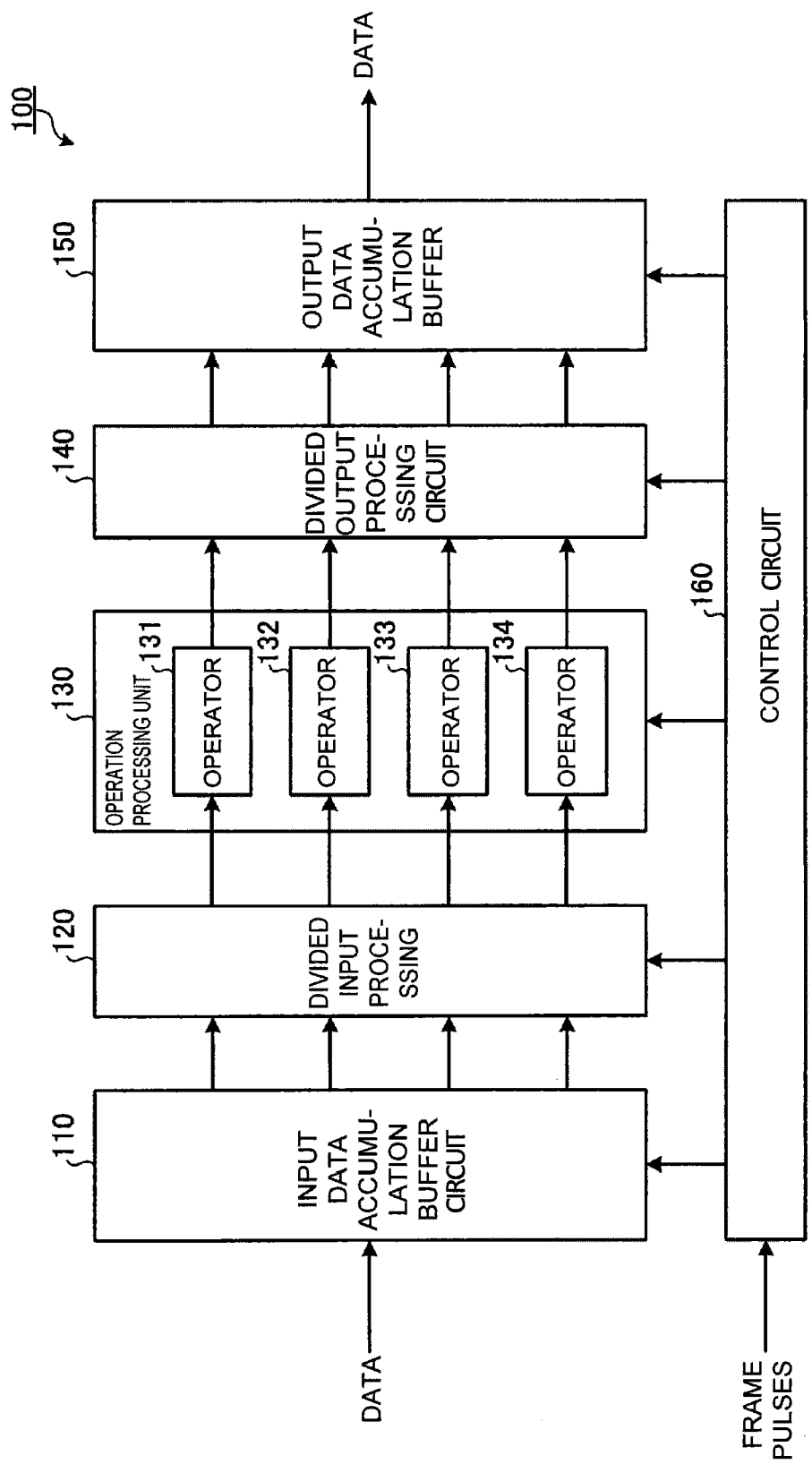

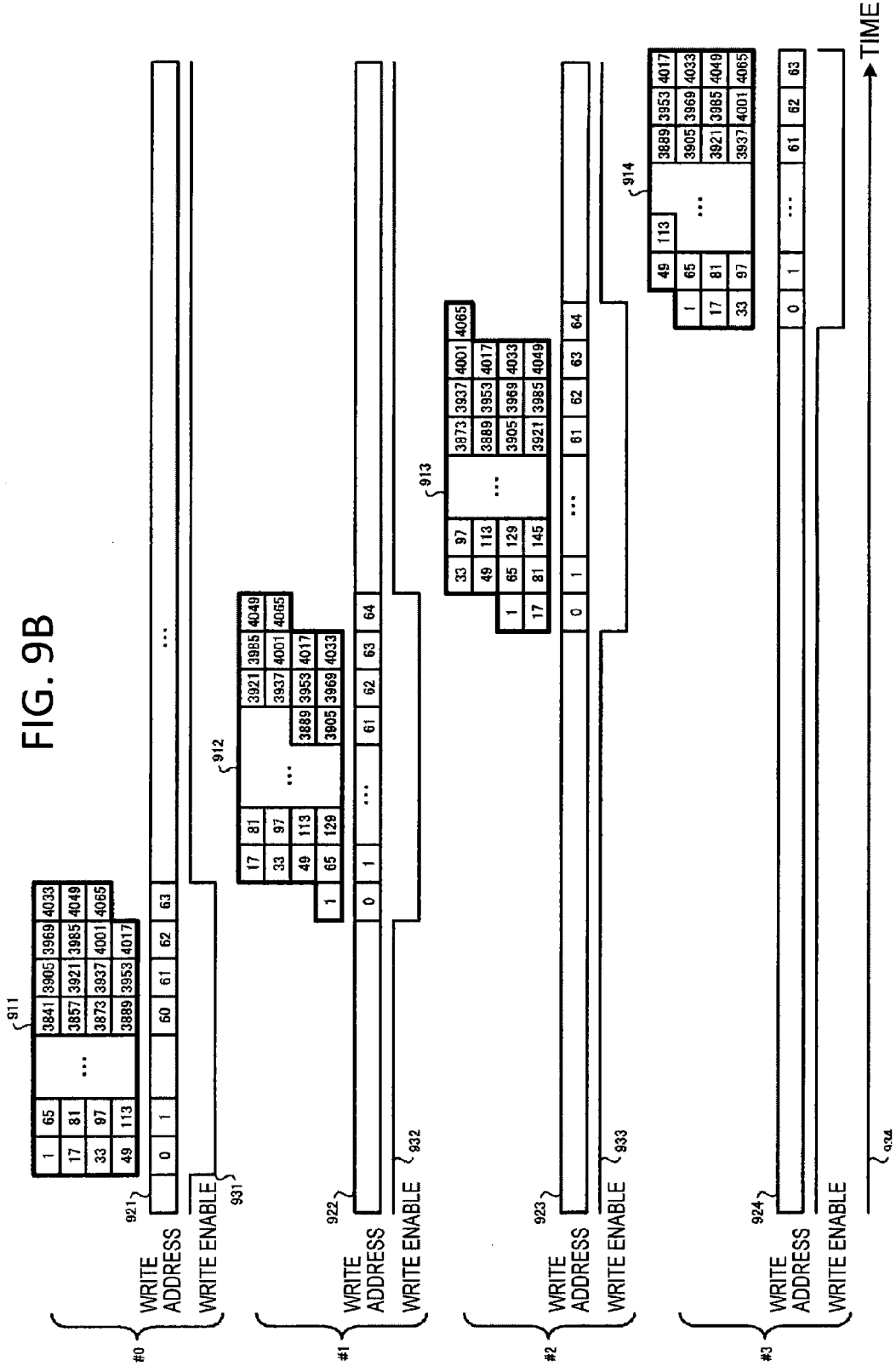

ERROR CORRECTION PROCESSING CIRCUIT AND ERROR CORRECTION PROCESSING METHOD

CROSS REFERENCE TO RELATED APPLICATION

This application is based upon and claims the benefit of priority from the prior Japanese Patent Application NO. 2011-140977 filed on Jun. 24, 2011, the entire contents of which are incorporated herein by reference.

FIELD

The embodiments disclosed hereafter are relates to an error correction processing circuit and an error correction processing method.

BACKGROUND

Optical Transport Network (OTN: ITU-T G.709), which employs optical paths and the like suitable for Dense Wavelength Division Multiplexing (DWDM) communication, has been standardized through development of optical technology. In the OTN, error correction according to Forward Error Correction (FEC) is used to secure quality of transmission paths in optical transfer networks.

Moreover, increased transmission capacity requests higher capacity communication at OTN rates such as OTU1 (2.5 [G]), OTU2 (10 [G]), OTU3 (40 [G]) and OTU4 (100 [G]). Accordingly, processing adapted to achieve the higher capacity communication is requested, for example, also in the FEC.

PATENT DOCUMENT

International Publication No. 2008/035469

In the above conventional art, clock speeds in FEC operations such as encoding and decoding are disadvantageously limited, and the achievement of the higher capacity communication is disadvantageously difficult.

SUMMARY

According to an aspect of the embodiments, there is provided an error correction processing circuit, includes: a division circuit that divides input data into a plurality of pieces of a predetermined data length; a plurality of operation circuits that are provided in parallel, and that perform operations of error correction for the plurality of pieces of data divided by the division circuit, respectively; a multiplexing circuit that multiplexes the plurality of pieces of data for which the operations have been performed by the plurality of operation circuits; and an output circuit that outputs the data multiplexed by the multiplexing circuit.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 5B is a diagram (1) illustrating an example of coefficients in respective multiplier circuits;

FIG. 5C is a diagram (2) illustrating an example of the coefficients in the respective multiplier circuits;

FIG. 5D is a diagram (3) illustrating an example of the coefficients in the respective multiplier circuits;

FIG. 8 is a diagram illustrating a configuration example of the error correction processing circuit according to Embodiment 2;

FIG. 9B is a diagram illustrating an example of writing the input data into the input data accumulation buffer;

DESCRIPTION OF EMBODIMENTS

Embodiments of an error correction processing circuit and an error correction processing method according to the present invention will be described in detail below with reference to the accompanying drawings.

Embodiment 1

Configuration of Error Correction Processing Circuit According to Embodiment 1

Figure 1:
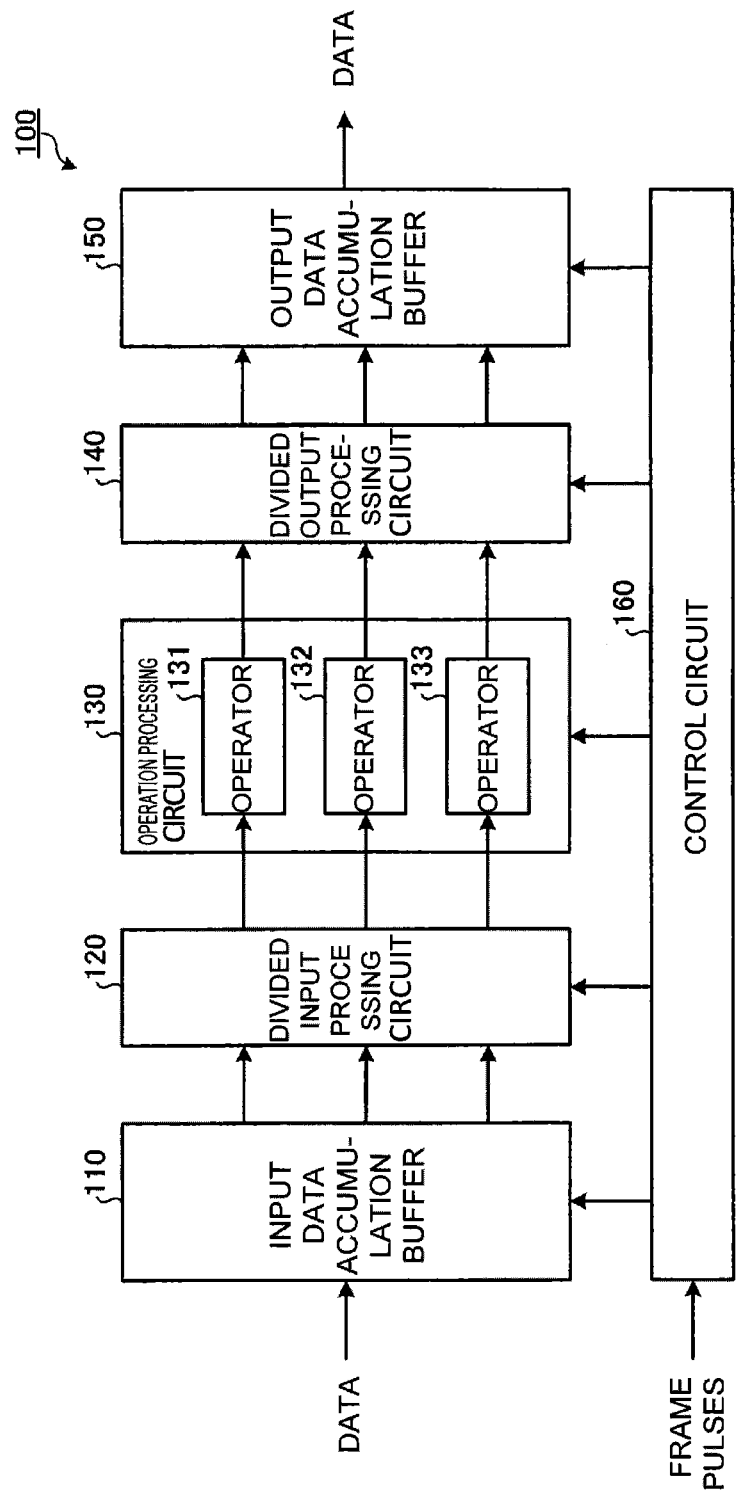
FIG. 1 is a diagram illustrating a configuration example of an error correction processing circuit according to Embodiment 1.

FIG. 1 is a diagram illustrating a configuration example of an error correction processing circuit according to Embodiment 1. An error correction processing circuit 100 illustrated in FIG. 1 is an error correction processing circuit that performs an FEC encoding process or an FEC decoding process. The FEC may include, for example, Reed-Solomon Coding (RS) such as RS (255, 239).

In Embodiment 1, the case where the error correction processing circuit 100 performs the FEC encoding will be described. The error correction processing circuit 100 includes an input data accumulation buffer 110, a divided input processing circuit 120, an operation processing circuit 130, a divided output processing circuit 140, an output data accumulation buffer 150, and a control circuit 160.

The input data accumulation buffer 110 is a division circuit that divides input data into pieces of a predetermined data length. Specifically, the input data accumulation buffer 110 is a buffer that accumulates the input data in circuits of SubFrames (Rows). The SubFrame is a circuit of a block for the FEC encoding.

The input data accumulation buffer 110 sequentially accumulates the input data in buffers of the number depending on the number of bits in the width of the input data. The input data accumulation buffer 110 has three buffers herein, and divides and stores the input data into each buffer. The control circuit 160 controls writing and reading data into/from the input data accumulation buffer 110.

The divided input processing circuit 120 converts each data read from each buffer in the input data accumulation buffer 110, into circuits of operations in the operation processing circuit 130. For example, if data having a width of 3×16 [bytes] is inputted into the error correction processing circuit 100, the divided input processing circuit 120 multiplexes the data at a ratio of 3:1. The divided input processing circuit 120 outputs the multiplexed data to the operation processing circuit 130. In this way, the divided input processing circuit 120 functions as a serial conversion circuit that converts the pieces of data divided by the input data accumulation buffer 110, into pieces of serial data such that each of the pieces of serial data corresponds to a bus width of each of operators 131 to 133.

The operation processing circuit 130 includes the operators 131 to 133 provided in parallel. Each of the operators 131 to 133 is an encoder that FEC-encodes a minimum circuit of data (for example, 8 [bits]). The operators 131 to 133 FEC-encode (perform operations of error correction for) three data series outputted from the divided input processing circuit 120, respectively. Each of the operators 131 to 133 outputs the encoded data to the divided output processing circuit 140. Note that the circuit of the operation in a circuit corresponding to a minimum circuit in each of the operators 131 to 133 is assumed to be 8 [bits], and a circuit of data to be processed is assumed to be 255 [bytes].

The divided output processing circuit 140 converts the three data series outputted from the operation processing circuit 130, into sequences for the output data accumulation buffer 150. For example, if the data having the width of 3×16 [bytes] is inputted into the error correction processing circuit 100, the divided output processing circuit 140 parallelizes the data at a ratio of 1:3. The divided output processing circuit 140 outputs the parallelized data to the output data accumulation buffer 150. In this way, the divided output processing circuit 140 functions as a parallel conversion circuit that converts pieces of data for which the operations have been performed by the operators 131 to 133, into pieces of parallel data such that each of the pieces of parallel data corresponds to a bus width in a state before the serial conversion performed by the divided input processing circuit 120.

The output data accumulation buffer 150 is a multiplexing circuit that multiplexes the pieces of data for which the operations have been performed by the operators 131 to 133. The output data accumulation buffer 150 is also an output circuit that outputs the multiplexed data. Specifically, the output data accumulation buffer 150 accumulates the data outputted from the divided output processing circuit 140, in circuits of SubFrames, and converts the accumulated data into data having the same width in bits (format) as the input data.

The control circuit 160 controls writing and reading data into/from the output data accumulation buffer 150. The data read from the output data accumulation buffer 150 is outputted to a stage subsequent to the error correction processing circuit 100. The data inputted into the error correction processing circuit 100 is thereby FEC-encoded and outputted from the error correction processing circuit 100.

Frame pulses are inputted into the control circuit 160. The frame pulses indicate the beginnings of frames of the data inputted into the error correction processing circuit 100. The control circuit 160 controls the writing and reading data into/from the input data accumulation buffer 110, based on the frame pulses. The control circuit 160 also controls the writing and reading data into/from the output data accumulation buffer 150, based on the frame pulses. The control circuit 160 may also control processing in the divided input processing circuit 120, the operation processing circuit 130 and the divided output processing circuit 140, based on the frame pulses.

In this way, in an operation process for data to be subjected to multiple operation processes, the error correction processing circuit 100 accumulates the input data in the input data accumulation buffer 110 once, sorts the data in the divided input processing circuit 120, and thereby divides the data into circuits processable at a subsequent stage. Then, the error correction processing circuit 100 performs a time division process for each piece of the input data for the operations in the operation processing circuit 130, accumulates the data in the output data accumulation buffer 150 while returning the data into original sequences in the divided output processing circuit 140, and outputs the accumulated data. This may realize an operation processing circuit capable of processing data regardless of a degree of parallelism and multiplicity.

(Communication System)

Figure 2:
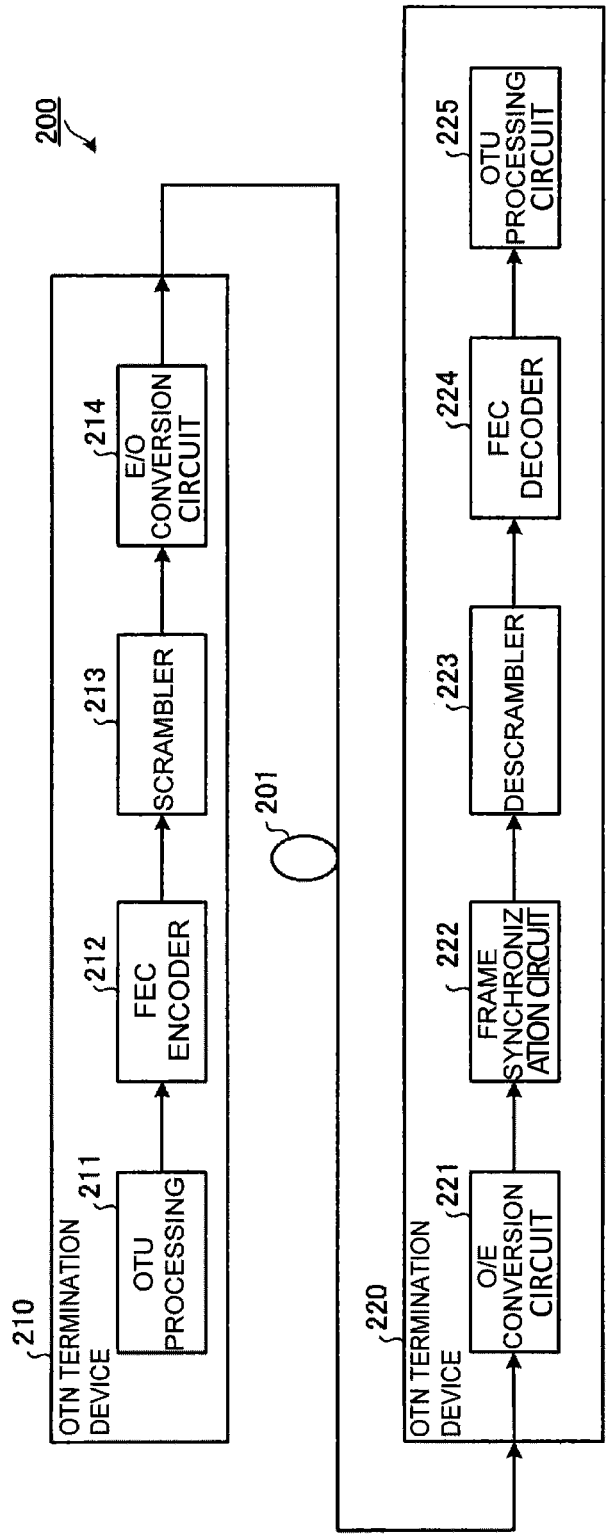
FIG. 2 is a diagram illustrating an example of a communication apparatus and a communication system to which the error correction processing circuit is applied.

FIG. 2 is a diagram illustrating an example of a communication apparatus and a communication system to which the error correction processing circuit is applied. A communication system 200 illustrated in FIG. 2 is a communication system that transmits and receives optical signals. The communication system 200 based on Optical Transport Network (OTN) is illustrated herein. The communication system 200 includes an OTN termination device 210 as a transmitter, an OTN termination device 220 as a receiver, and an optical transmission path 201.

The OTN termination device 210 includes an OTU processing circuit 211, an FEC encoder 212, a scrambler 213, and an E/O conversion circuit 214. According to Optical-channel Transport Circuit (OTU) processing, the OTU processing circuit 211 generates data to be transmitted, and outputs the generated data to the FEC encoder 212.

The FEC encoder 212 FEC-encodes the data outputted from the OTU processing circuit 211. For example, the error correction processing circuit 100 illustrated in FIG. 1 is applicable to the FEC encoder 212. The FEC encoder 212 outputs the encoded data to the scrambler 213.

The scrambler 213 scrambles the data outputted from the FEC encoder 212. The scrambler 213 outputs the scrambled data to the E/O conversion circuit 214. The E/O conversion circuit 214 converts the data outputted from the scrambler 213, into an optical signal. The E/O conversion circuit 214 outputs the optical signal provided in the conversion, to the optical transmission path 201.

The optical transmission path 201 transmits the optical signal outputted from the E/O conversion circuit 214, to the OTN termination device 220. The optical transmission path 201 is, for example, a fiber-optic path. The OTN termination device 220 includes an O/E conversion circuit 221, a frame synchronization circuit 222, a descrambler 223, an FEC decoder 224, and an OTU processing circuit 225.

The O/E conversion circuit 221 converts the optical signal transmitted from the OTN termination device 210 through the optical transmission path 201, into an electrical signal. The O/E conversion circuit 221 outputs the data converted into the electrical signal, to the frame synchronization circuit 222. The frame synchronization circuit 222 (Frame Aligner) performs frame synchronization of the data outputted from the O/E conversion circuit 221. The frame synchronization circuit 222 outputs the frame-synchronized data to the descrambler 223.

The descrambler 223 descrambles the data outputted from the frame synchronization circuit 222. The descrambler 223 outputs the descrambled data to the FEC decoder 224. The FEC decoder 224 FEC-decodes the data outputted from the descrambler 223 to perform error correction for the data. The FEC decoder 224 outputs the error-corrected data to the OTU processing circuit 225. The OTU processing circuit 225 performs an OTU termination process for the data outputted from the FEC decoder 224.

In this way, the error correction processing circuit 100 illustrated in FIG. 1 is applicable to the communication apparatus (for example, the OTN termination device 210) in the communication system 200 that uses the FEC to transmit the optical signals. The communication system 200, however, is not limited to the communication system that performs communication with the optical signals, and may be a communication system that performs communication with electrical signals or wireless signals.

(Frame Format)

Figure 3A:
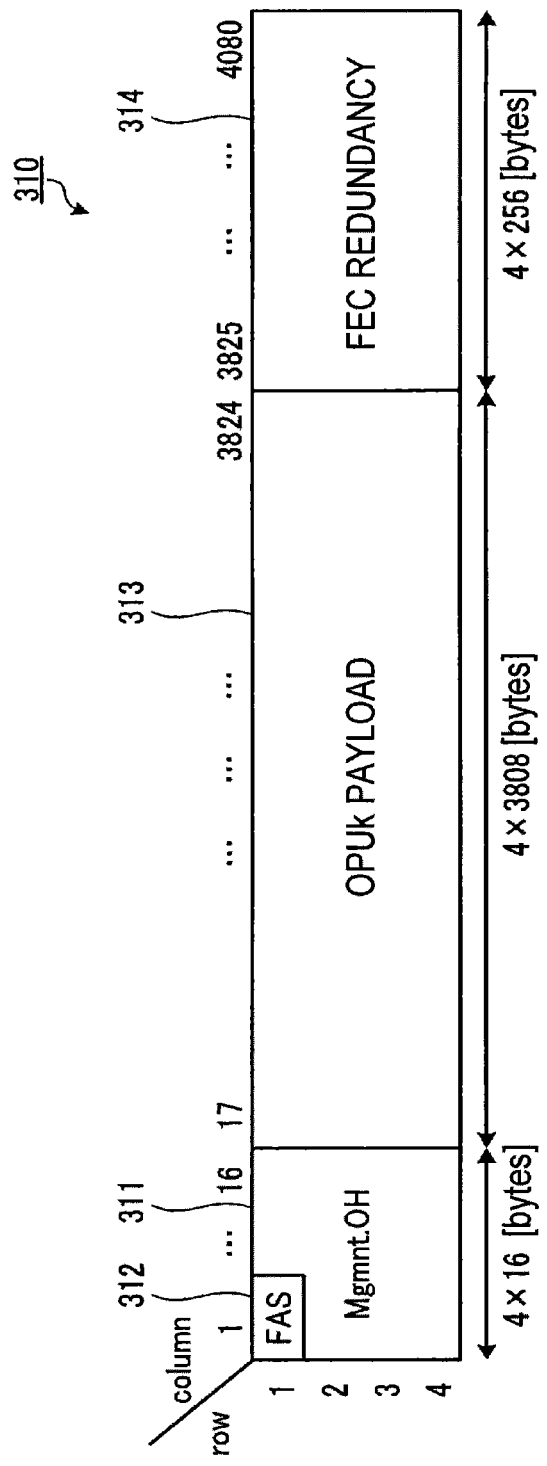
FIG. 3A is a diagram illustrating an example of a frame format.

FIG. 3A is a diagram illustrating an example of a frame format. A frame format 310 illustrated in FIG. 3A is an example of a frame format (OTUk) of the data transmitted in the communication system 200 illustrated in FIG. 2. As illustrated in the frame format 310, the data transmitted in the communication system 200 has 4080 [bytes]×4 rows, including an overhead 311 (Mgmnt.OH), an OPUk payload 313, and an FEC redundancy 314.

The overhead 311 is an overhead of 4×16 [bytes]. The overhead 311 includes a frame alignment signal (FAS) 312 indicating the beginning of a frame. The OPUk payload 313 is a payload of 4×3808[bytes]. The FEC redundancy 314 is an FEC parity of 4×256 [bytes].

Figure 3B:
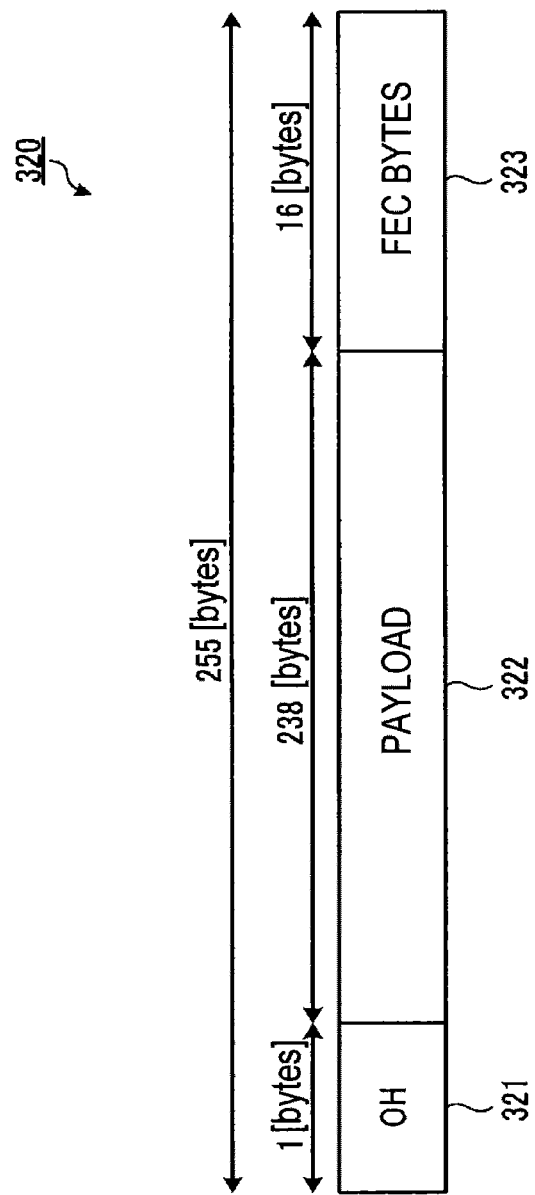
FIG. 3B is a diagram illustrating an example of a circuit of an FEC operation.

FIG. 3B is a diagram illustrating an example of a circuit of an FEC operation. A SubFrame 320 illustrated in FIG. 3B denotes a SubFrame that is a circuit of an operation in the FEC encoder 212 or the FEC decoder 224 illustrated in FIG. 2. The SubFrame 320 has a data length of 255 [bytes], in which 16 SubFrames 320 correspond to one row of the frame format 310 illustrated in FIG. 3A.

The SubFrame 320 includes an overhead 321 (OH), a payload 322 and an FEC bytes 323. The overhead 321 is an overhead of 1 [byte], which is information indicating an optical channel for data. The payload 322 is a payload of 238 [bytes]. The FEC bytes 323 are an FEC parity of 16 [bytes].

(Specific Configuration Example of Error Correction Processing Circuit)

Figure 4:
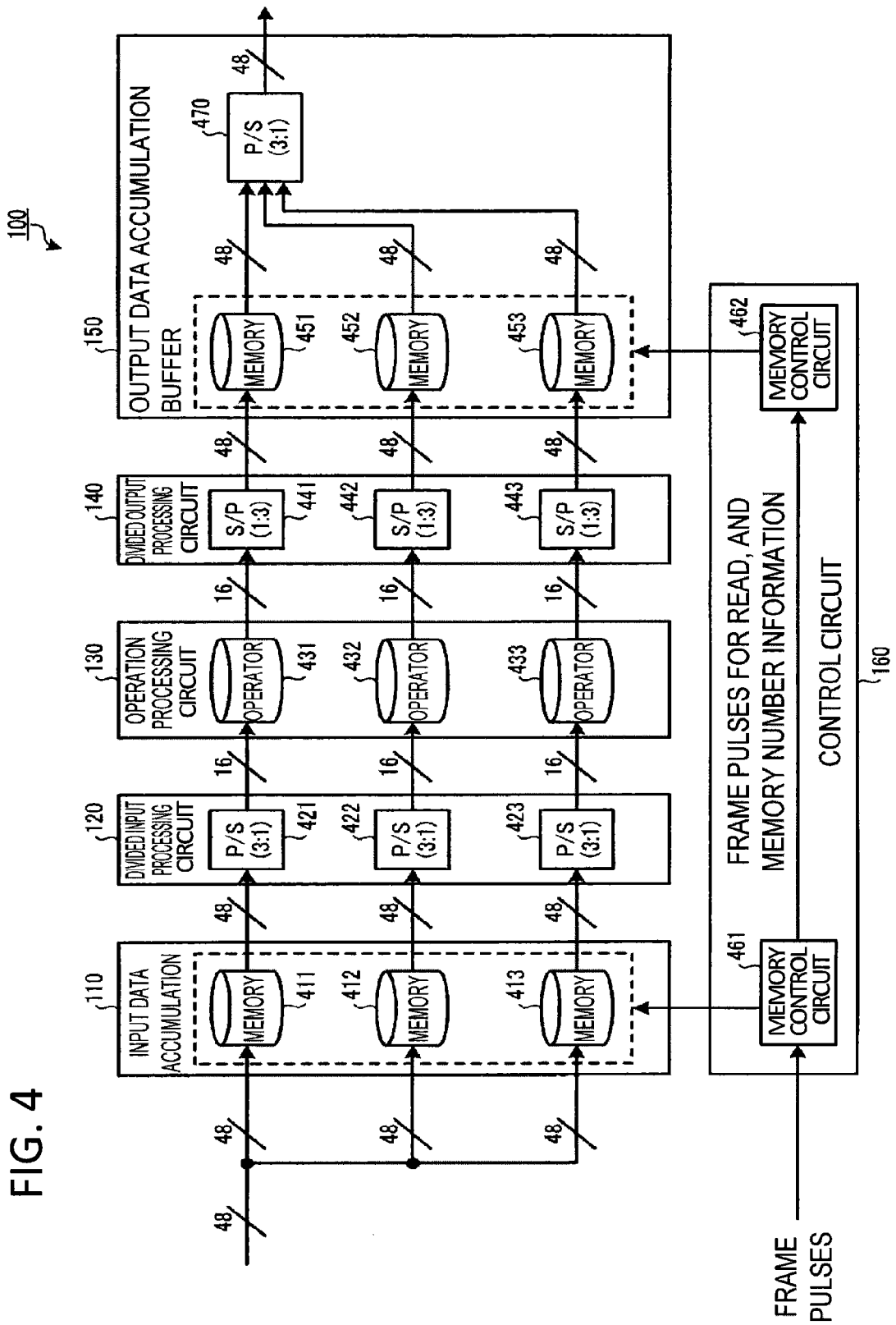
FIG. 4 is a diagram illustrating a specific configuration example of the error correction processing circuit.

FIG. 4 is a diagram illustrating a specific configuration example of the error correction processing circuit. In FIG. 4, portions similar to those illustrated in FIG. 1 are assigned the same reference numerals and will not be described. As illustrated in FIG. 4, data having a width of 3×16=48 [bytes] is assumed to be inputted into the error correction processing circuit 100. The input data accumulation buffer 110 includes memories 411 to 413 as buffers. The divided input processing circuit 120 includes parallel/serial conversion circuits 421 to 423.

The operation processing circuit 130 includes operators 431 to 433. The divided output processing circuit 140 includes serial/parallel conversion circuits 441 to 443. The output data accumulation buffer 150 includes memories 451 to 453 as buffers, and a parallel/serial conversion circuit 470. The control circuit 160 includes a memory control circuit 461 and a memory control circuit 462.

The data having the width of 48 [bytes], which has been inputted into the error correction processing circuit 100, is inputted into each of the memories 411 to 413. The memories 411 to 413 store the input data in periods indicated by the memory control circuit 461, respectively. The memories 411 to 413 also output the stored data to the parallel/serial conversion circuits 421 to 423, in periods indicated by the memory control circuit 461, respectively.

The memory control circuit 461 in the control circuit 160 controls the memories 411 to 413 based on the inputted frame pulses. Specifically, the memory control circuit 461 outputs write instruction signals to the memories 411 to 413, respectively, to write data corresponding to different periods, into the memories 411 to 413, respectively. The data inputted into the error correction processing circuit 100 may be thereby temporally divided (divided into three pieces of data) and stored into the memories 411 to 413. The memory control circuit 461 also outputs read instruction signals to the memories 411 to 413, respectively, to output the data written into the memories 411 to 413, to the parallel/serial conversion circuits 421 to 423, respectively.

The memory control circuit 461 also outputs frame pulses for read and memory number information to the memory control circuit 462. The frame pulses for read are frame pulses based on timings when the data in the memories 411 to 413 has been read, and are information indicating timings of reading the data, in the memory control circuit 462. The memory number information is information indicating states of the data to be written into the memories 411 to 413.

The parallel/serial conversion circuits 421 to 423 multiplex the data having the width of 48 [bytes] outputted from the memories 411 to 413, respectively, at the ratio of 3:1, to convert the data into data having a width of 16 [bytes]. The parallel/serial conversion circuits 421 to 423 output the converted data having the width of 16 [bytes] to the operators 431 to 433, respectively.

The operators 431 to 433 are components corresponding to the operators 131 to 133 illustrated in FIG. 1, respectively. The operators 431 to 433 encode the data having the width of 16 [bytes] outputted from the parallel/serial conversion circuits 421 to 423, respectively, in 16 parallel processes. The operators 431 to 433 output the encoded data having the width of 16 [bytes] to the serial/parallel conversion circuits 441 to 443, respectively.

The serial/parallel conversion circuits 441 to 443 parallelize the data having the width of 16 [bytes] outputted from the operators 431 to 433, respectively, at the ratio of 1:3, to convert the data into data having the width of 48 [bytes]. The serial/parallel conversion circuits 441 to 443 output the converted data having the width of 48 [bytes] to the memories 451 to 453, respectively.

The memories 451 to 453 store the data outputted from the serial/parallel conversion circuits 441 to 443, in periods indicated by the memory control circuit 462, respectively. The memories 451 to 453 also output the stored data to the parallel/serial conversion circuit 470, in periods indicated by the memory control circuit 462, respectively.

The memory control circuit 462 in the control circuit 160 controls the memories 451 to 453 based on the frame pulses for read and the memory number information that have been outputted from the memory control circuit 461. Specifically, the memory control circuit 462 outputs write instruction signals to the memories 451 to 453, respectively, to write the data outputted from the serial/parallel conversion circuits 441 to 443, into the memories 451 to 453, respectively. The memory control circuit 462 also outputs read instruction signals to the memories 451 to 453, respectively, to output the data written into the memories 451 to 453, to the parallel/serial conversion circuit 470.

The parallel/serial conversion circuit 470 multiplexes data having a width of 3×48 [bytes] outputted from the memories 451 to 453, at the ratio of 3:1, to convert the data into data having the width of 48 [bytes]. The parallel/serial conversion circuit 470 outputs the converted data having the width of 48 [bytes] to the stage subsequent to the error correction processing circuit 100.

In this way, the error correction processing circuit 100 converts data having a width of 16×N [bytes] (N=3 in FIG. 4) into data in a format of 16 [bytes] for the operators 431 to 433, in the divided input processing circuit 120. In this case, N operators 431 to 433 are used. The error correction processing circuit 100 also converts data of 16 [bytes] outputted from the operators 431 to 433, into data having the width of 16×N [bytes], in the divided output processing circuit 140. According to the error correction processing circuit 100, even input data at a high bit rate (for example, 40 [G] or 100 [G]) may be processed with an increased number of processes in parallel N.

(Configuration Example of Operator)

Figure 5A:
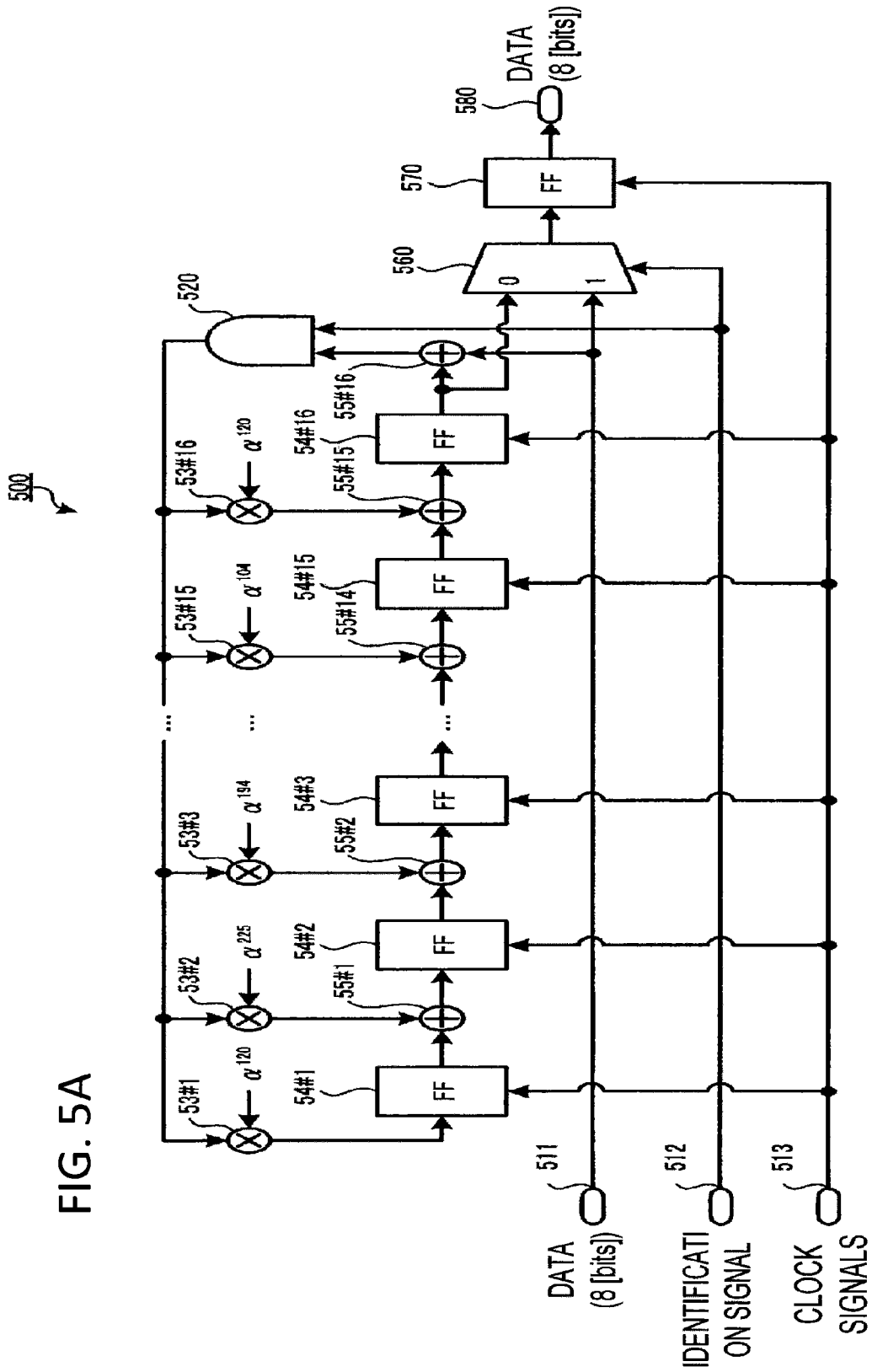
FIG. 5A is a diagram illustrating a configuration example of an operator.

FIG. 5A is a diagram illustrating a configuration example of the operator. An operator 500 illustrated in FIG. 5A is a configuration example of an FEC encoder in OTN G709 Standard FEC RS (255, 239). The operator 500 is a basic circuit corresponding to a minimum circuit, and encodes data having a width of 1 [byte] (width of 8 [bits]). For example, each of the operators 431 to 433 illustrated in FIG. 4 may be realized by 16 operators 500 provided in parallel.

As illustrated in FIG. 5A, the operator 500 includes input circuits 511 to 513, an AND circuit 520, 16 multiplier circuits 53#1 to 53#16, 16 flip-flop circuits 54#1 to 54#16, 16 adder circuits 55#1 to 55#16, a selector 560, a flip-flop circuit 570 and an output circuit 580.

Data (I_DT) having a width of 8 bits ([7:0]), which is an operation target, is inputted into the input circuit 511. The input circuit 511 outputs the input data to the adder circuit 55#16 and the selector 560. An identification signal (I_EN) of the data is inputted into the input circuit 512. The identification signal is a signal indicating a separation between an FEC area and a data area in the data inputted from the input circuit 511. The FEC area of the data is, for example, the payload 322 illustrated in FIG. 3B. The data area of the data is, for example, the FEC bytes 323 illustrated in FIG. 3B.

During a period in which the FEC area of the data is inputted into the input circuit 511, the identification signal of "0" is inputted into the input circuit 512. Moreover, during a period in which the data area of the data is inputted into the input circuit 511, the identification signal of "1" is inputted into the input circuit 512. The identification signal is outputted, for example, from the OTU processing circuit 211 illustrated in FIG. 2. The input circuit 512 outputs the inputted identification signal to the AND circuit 520 and the selector 560.

Clock signals (I_CLK) are inputted into the input circuit 513. The clock signals are signals indicating operation timings in the operator 500. The clock signals are outputted, for example, from the OTU processing circuit 211 illustrated in FIG. 2. The input circuit 513 outputs the inputted clock signals to the flip-flop circuits 54#1 to 54#16 and 570.

The AND circuit 520 outputs a logical AND of the data outputted from the adder circuit 55#16 and the identification signal outputted from the input circuit 512. Accordingly, only a portion of the data area of the data outputted from the adder circuit 55#16 is outputted from the AND circuit 520. The data outputted from the AND circuit 520 is outputted to the multiplier circuits 53#1 to 53#16.

Each of the multiplier circuits 53#1 to 53#16 multiplies the data outputted from the AND circuit 520 by a predetermined coefficient. The coefficients used in the multiplication by the multiplier circuits 53#1 to 53#16 are, for example, $\alpha^{120}$, $\alpha^{225}$, $\alpha^{194}$, $\alpha^{182}$, $\alpha^{169}$, $\alpha^{147}$, $\alpha^{191}$, $\alpha^{91}$, $\alpha^{3}$, $\alpha^{76}$, $\alpha^{161}$, $\alpha^{102}$, $\alpha^{109}$, $\alpha^{107}$, $\alpha^{104}$ and $\alpha^{120}$, respectively (see FIG. 5B). The multiplier circuits 53#1 to 53#16 output the data multiplied by the coefficients to the flip-flop circuits 54#1 to 54#16, respectively.

The flip-flop circuit 54#1 (FF: Flip Flop) temporarily retains the data outputted from the multiplier circuit 53#1, and outputs the retained data to the adder circuit 55#1 at the timing indicated by the clock signal from the input circuit 513. The adder circuit 55#1 adds the data outputted from the flip-flop circuit 54#1 and the data outputted from the multiplier circuit 53#2, and outputs the added data to the flip-flop circuit 54#2.

The flip-flop circuit 54#2 temporarily retains the data outputted from the adder circuit 55#1, and outputs the retained data to the adder circuit 55#2 at the timing indicated by the clock signal from the input circuit 513. The adder circuit 55#2 adds the data outputted from the flip-flop circuit 54#2 and the data outputted from the multiplier circuit 53#3, and outputs the added data to the flip-flop circuit 54#3.

The flip-flop circuit 54#M (M=3 to 15) similarly temporarily retains the data outputted from the adder circuit 55#M−1, and outputs the retained data to the adder circuit 55#M at the timing indicated by the clock signal from the input circuit 513. The adder circuit 55#M adds the data outputted from the flip-flop circuit 54#M and the data outputted from the multiplier circuit 53#M+1, and outputs the added data to the flip-flop circuit 54#M+1.

The flip-flop circuit 54#16 temporarily retains the data outputted from the adder circuit 55#15, and outputs the retained data to the adder circuit 55#16 and the selector 560 at the timing indicated by the clock signal from the input circuit 513. The adder circuit 55#16 adds the data outputted from the flip-flop circuit 54#16 and the data outputted from the input circuit 511, and outputs the added data to the AND circuit 520.

The selector 560 selects any one of the data outputted from the input circuit 511 and the data outputted from the flip-flop circuit 54#16, based on the identification signal from the input circuit 512, and outputs the selected data to the flip-flop circuit 570. Specifically, the selector 560 selects the data outputted from the flip-flop circuit 54#16 if the identification signal of "0" is inputted, and selects the data outputted from the input circuit 511 if the identification signal of "1" is inputted. The data outputted from the flip-flop circuit 54#16 may be thereby attached as the FEC area to the data area of the data outputted from the input circuit 511, and the entire data may be outputted to the flip-flop circuit 570. The data may be thereby FEC-encoded.

The flip-flop circuit 570 temporarily retains the data outputted from the selector 560, and outputs the retained data to the output circuit 580 at the timing indicated by the clock signal from the input circuit 513. The output circuit 580 outputs the data outputted from the flip-flop circuit 570, to a stage subsequent to the operator 500. Note that the operator 500 may include an input circuit into which a reset signal for resetting the flip-flop circuits 54#1 to 54#16 is inputted, and the like. The operator 500 may also have a configuration without the flip-flop circuit 570.

For example, in the case of a clock signal of 83.6665823 [MHz], the operator 500 illustrated in FIG. 5 may be adapted to OTU2 at 10 [G] and the like, through performing the operation in 8 [bits]×16 operation processes.

FIGS. 5B to 5D are diagrams illustrating an example of the coefficients in the respective multiplier circuits. For example, the respective coefficients illustrated in FIGS. 5B and 5C may be used for the coefficients used in the multiplication by the multiplier circuits 53#1 to 53#16, $\alpha^{120}$, $\alpha^{225}$, $\alpha^{194}$, $\alpha^{182}$, $\alpha^{169}$, $\alpha^{147}$, $\alpha^{191}$, $\alpha^{191}$, $\alpha^{3}$, $\alpha^{76}$, $\alpha^{161}$, $\alpha^{102}$, $\alpha^{109}$, $\alpha^{107}$, $\alpha^{104}$ and $\alpha^{120}$.

(Control of Each Buffer by Control Circuit)

Figure 6A:
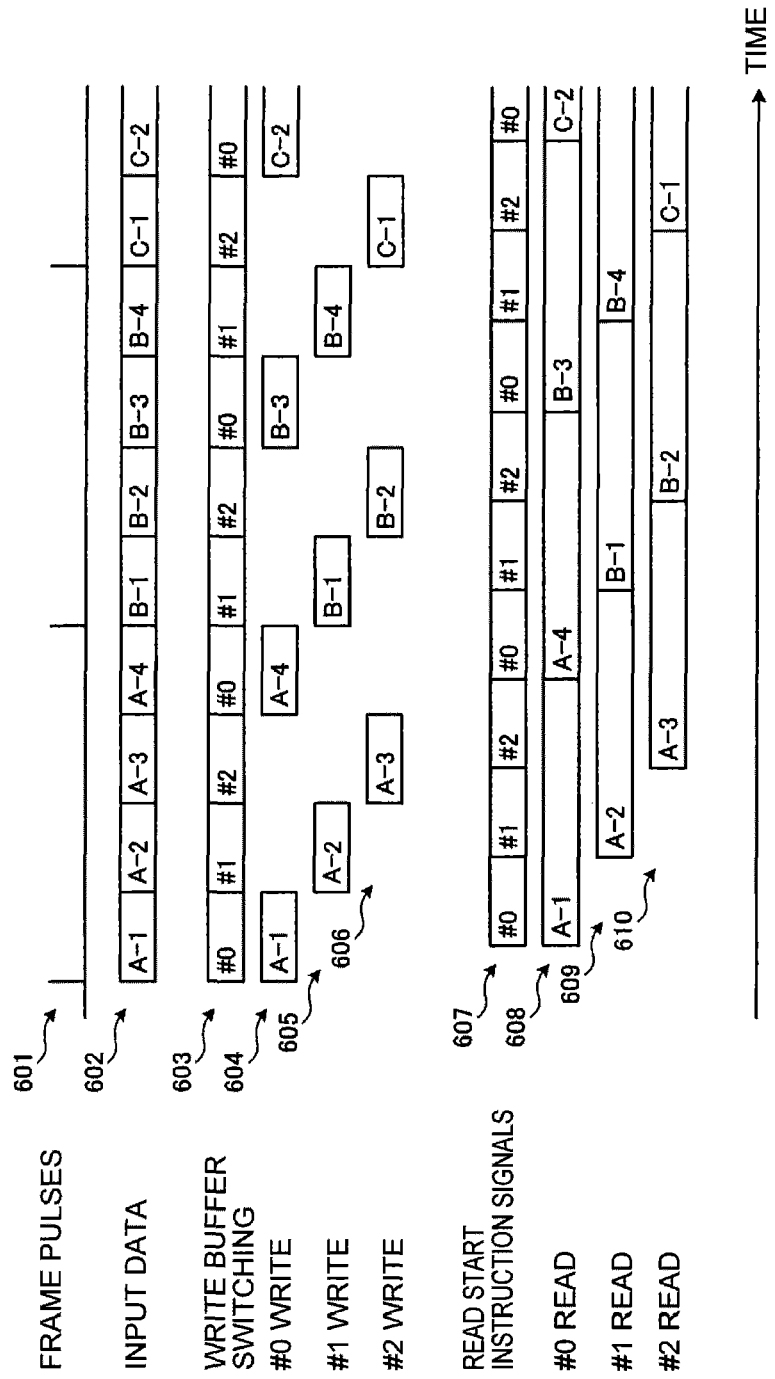
FIG. 6A is a diagram illustrating an example of control of an input data accumulation buffer by a control circuit.

FIG. 6A is a diagram illustrating an example of the control of the input data accumulation buffer by the control circuit. In FIG. 6A, a horizontal axis denotes time. Moreover, in FIG. 6A, the memories 411 to 413 are denoted as #0 to #2, respectively. Frame pulses 601 are the frame pulses to be inputted into the error correction processing circuit 100. The frame pulses 601 are the pulses indicating the beginnings of the frames of the data to be inputted into the error correction processing circuit 100.

Input data 602 is the data to be inputted into the error correction processing circuit 100. The input data 602 includes four SubFrames in each frame indicated by the frame pulse 601. For example, the input data 602 includes four Sub-Frames of "A-1" to "A-4" as a first frame. The input data 602 also includes four SubFrames of "B-1" to "B-4" as a second frame. The input data 602 also includes four SubFrames of "C-1," "C-2,"... as a third frame.

Write buffer switching signals 603 are signals that are outputted from the memory control circuit 461 in the control circuit 160, and that instruct to switch the memory into which the input data 602 is written, among the memories 411 to 413 (#0 to #2). As illustrated in the write buffer switching signals 603, the memory control circuit 461 switches the memory into which the input data 602 is written, as #0, #1, #2, #0, #1, #2,... at each separation between the SubFrames in the input data 602. The SubFrames of the input data 602 are thereby distributed and written into the memories 411 to 413, respectively.

Write states 604 to 606 are the states of the data to be written into the memories 411 to 413 (#0 to #2), respectively. As illustrated in the write state 604, writing into the memory 411 is instructed at timings when the input data 602 is "A-1," "A-4," "B-3" and "C-2." "A-1," "A-4," "B-3" and "C-2" are accordingly written into the memory 411.

As illustrated in the write state 605, writing into the memory 412 is instructed at timings when the input data 602 is "A-2," "B-1" and "B-4." "A-2," "B-1" and "B-4" are accordingly written into the memory 412. As illustrated in the write state 606, writing into the memory 413 is instructed at timings when the input data 602 is "A-3," "B-2" and "C-1." "A-3," "B-2" and "C-1" are accordingly written into the memory 413.

Read start instruction signals 607 are signals that are outputted from the memory control circuit 461 in the control circuit 160, and that instruct the memories 411 to 413 (#0 to #2) to start reading the written data. As illustrated in the read start instruction signals 607, the memory control circuit 461 instructs the memories 411 to 413 to start reading the written data, each time the data is written into the memories 411 to 413.

Read states 608 to 610 are states of the data to be read from the memories 411 to 413 (#0 to #2), respectively. As illustrated in the read states 608 to 610, the respective SubFrames of the input data 602 are distributed into three systems, and outputted from the memories 411 to 413 to the parallel/serial conversion circuits 421 to 423, respectively.

Figure 6B:
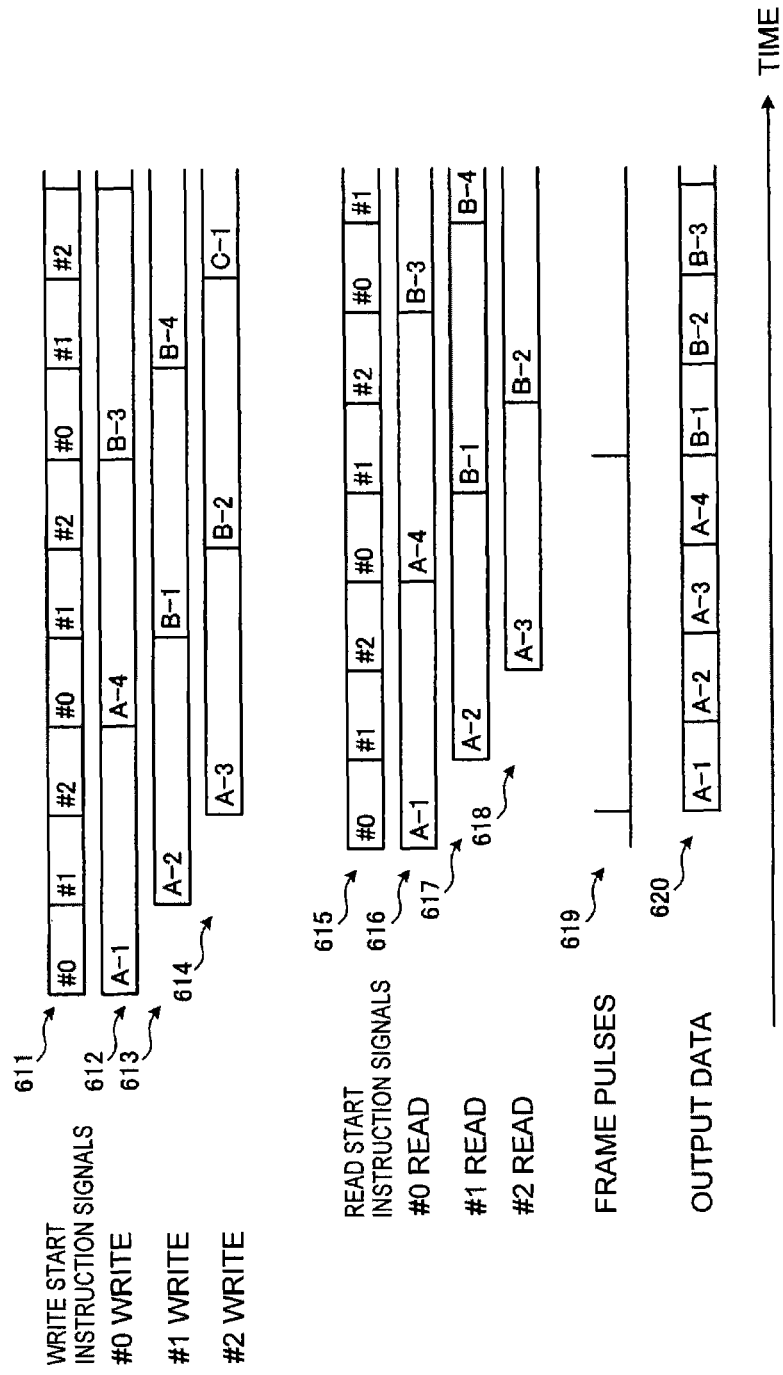
FIG. 6B is a diagram illustrating an example of control of an output data accumulation buffer by the control circuit and output data.

FIG. 6B is a diagram illustrating an example of the control of the output data accumulation buffer by the control circuit and the output data. In FIG. 6B, descriptions of portions similar to those illustrated in FIG. 6A will be omitted. Moreover, in FIG. 6B, the memories 451 to 453 are denoted as #0 to #2, respectively.

Write start instruction signals 611 are signals that are outputted from the memory control circuit 462, and that instruct the memories 451 to 453 (#0 to #2) to start writing the data. The memory control circuit 462 instructs the memories 451 to 453 to write the data outputted from the operators 431 to 433, respectively, in synchronization with the FEC encoding performed by the operators 431 to 433. Specifically, the memory control circuit 462 outputs the write start instruction signals 611 based on the frame pulses for read and the memory number information that are outputted from the memory control circuit 461.

Write states 612 to 614 are states of the data to be written into the memories 451 to 453 (#0 to #2), respectively. As illustrated in the write states 612 to 614, the data encoded by the operators 431 to 433 is written into the memories 451 to 453, respectively.

Read start instruction signals 615 are signals that are outputted from the memory control circuit 462, and that instruct the memories 451 to 453 (#0 to #2) to start reading the written data. As illustrated in the read start instruction signals 615, the memory control circuit 462 instructs the memories 451 to 453 to start reading the written data, each time the data is written into the memories 451 to 453.

Read states 616 to 618 are states of the data to be read from the memories 451 to 453 (#0 to #2), respectively. As illustrated in the read states 616 to 618, the data written into the memories 451 to 453 is sequentially read from the memories 451 to 453 and outputted to the parallel/serial conversion circuit 470.

Frame pulses 619 are the pulses indicating the beginnings of the frames of the data to be outputted from the memories 451 to 453 to the parallel/serial conversion circuit 470. The frame pulses 619 are outputted, for example, from the control circuit 160 to the parallel/serial conversion circuit 470.

Output data 620 denotes the data to be outputted from the parallel/serial conversion circuit 470. The parallel/serial conversion circuit 470 switches and outputs the data outputted from the memories 451 to 453, in synchronization with the frame pulses 619. The data outputted from the memories 451 to 453 is thereby outputted as a serial signal.

(Writing Input Data into Input Data Accumulation Buffer)

Figure 7A:
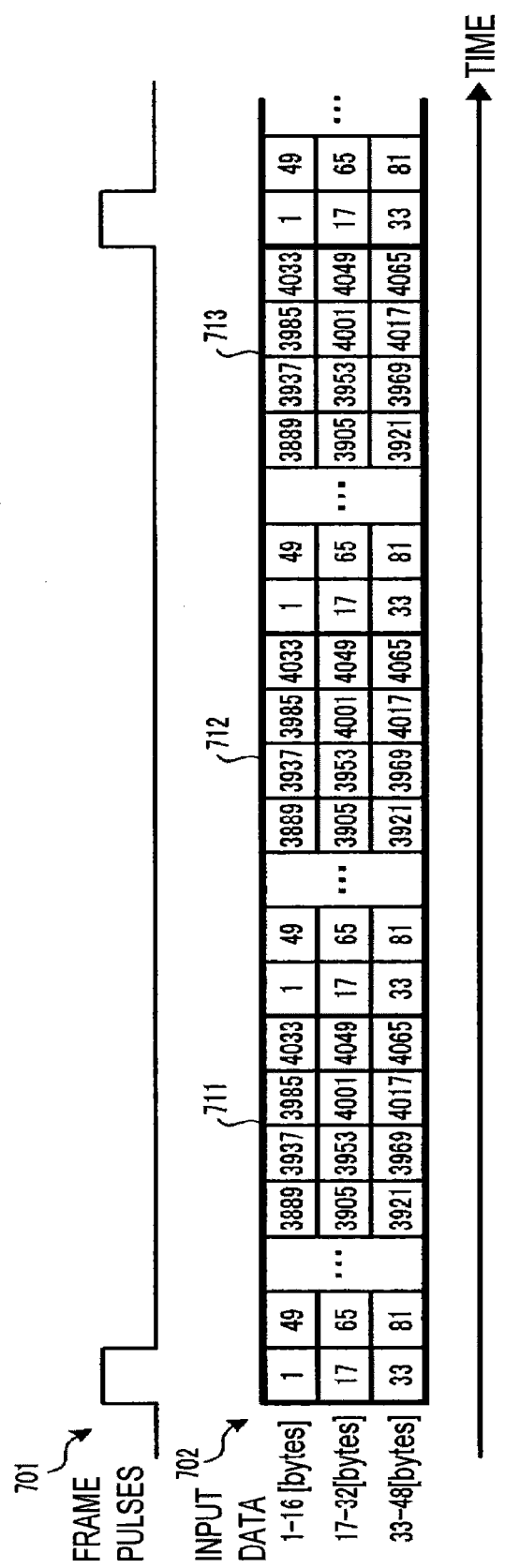
FIG. 7A is a diagram illustrating an example of input data.

FIG. 7A is a diagram illustrating an example of the input data. Frame pulses 701 and input data 702 illustrated in FIG. 7A are examples of the frame pulses 601 and the input data 602 illustrated in FIG. 6A, respectively. The input data 702 has a data width of 48 [bytes]. Each box in the input data 702 denotes data of 16 [bytes]. As illustrated in FIG. 7A, one frame of the input data 702 is divided into three SubFrames corresponding to the operators 131 to 133.

For example, the input data 702 includes SubFrames 711 to 713 in a first frame illustrated in FIG. 7A. Each of the SubFrames 711 to 713 is a SubFrame of 4080 [bytes] per row. As illustrated in FIG. 7A, if the input data 702 has a data width of N×16 [bytes] (N is a divisor of 255), no overlap among the SubFrames occurs in columns at boundaries among Sub-Frame circuits.

Figure 7B:
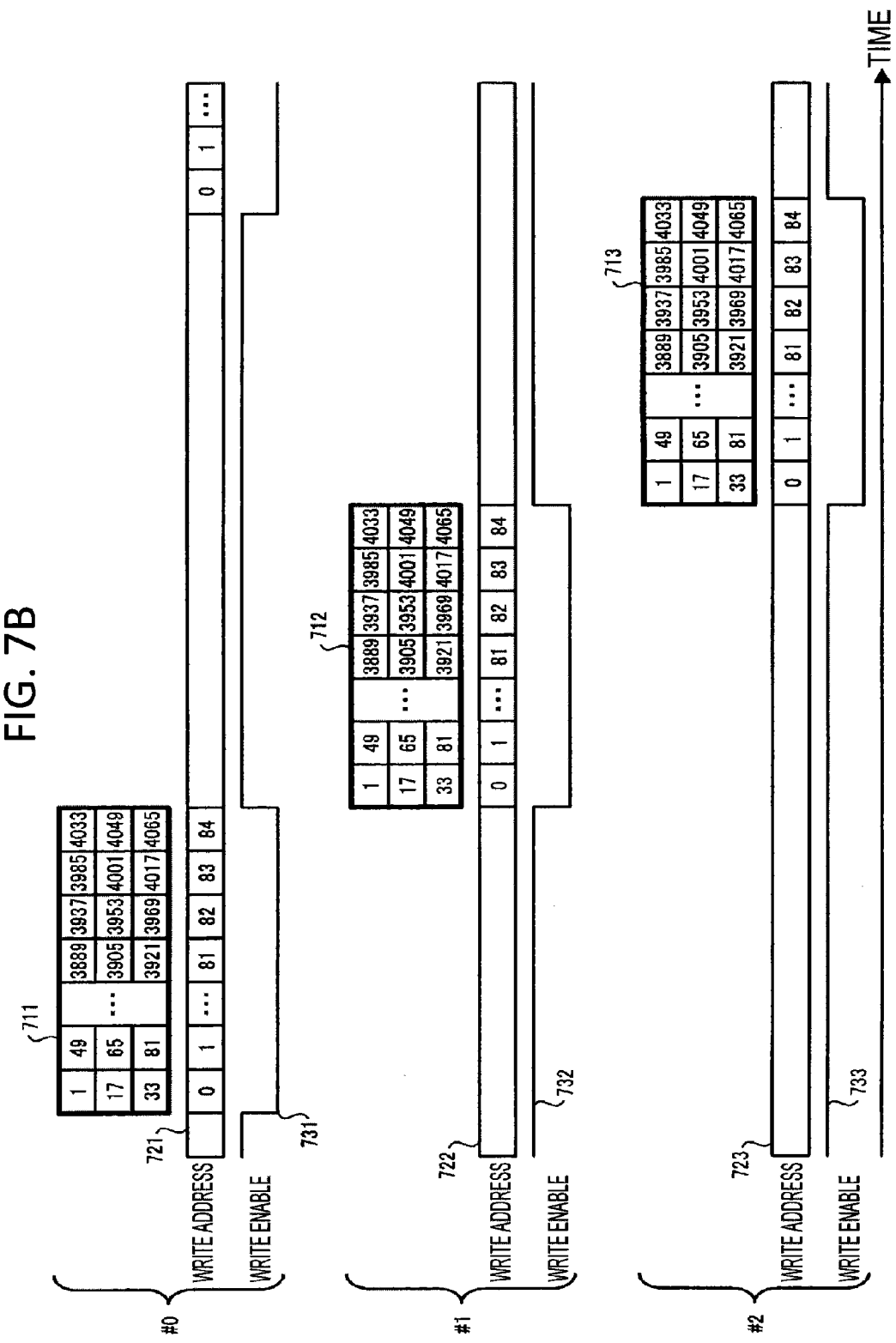
FIG. 7B is a diagram illustrating an example of writing the input data into the input data accumulation buffer.

FIG. 7B is a diagram illustrating an example of writing the input data into the input data accumulation buffer. A write address 721 and write enable 731 illustrated in FIG. 7B are a write address and the write instruction signal for the memory 411 (#0). The memory control circuit 461 sets the write address 721 and the write enable 731 such that the SubFrame 711 is written into the memory 411.

A write address 722 and write enable 732 are a write address and a write signal for the memory 412 (#1). The memory control circuit 461 sets the write address 722 and the write enable 732 such that the SubFrame 712 is written into the memory 412. A write address 723 and write enable 733 are a write address and a write signal for the memory 413 (#2). The memory control circuit 461 sets the write address 723 and the write enable 733 such that the SubFrame 713 is written into the memory 413.

In the examples illustrated in FIGS. 7A and 7B, since no overlap among the SubFrames occurs in the columns at the boundaries among the SubFrame circuits, the input data 702 may be divided into the respective SubFrames without any temporal overlap, and the respective SubFrames may be written into the memories 411 to 413. Accordingly, the rows at the beginnings of the respective SubFrames are aligned, and write cycles (the write enables 731 to 733) for the memories 411 to 413 are aligned. Consequently, the memory control circuit 461 in the control circuit 160 may easily control the memories 411 to 413, for example, without respective control circuits provided for the memories 411 to 413.

In this way, according to the error correction processing circuit 100 of Embodiment 1, target data may be divided into circuits of the FEC operation, and respective pieces of the divided data may be FEC-encoded by multiple operation circuits in parallel. Higher capacity communication may be thereby achievable, for example, without increased clock speeds of the operation circuits.

Note that, for example, in order to realize an FEC encoder in OTU4 RS, it is also conceivable to perform a multistep processing operation for a Galois operation to realize parallel operation processing. However, logical processing is repeated for multiple steps in the multistep processing operation of the Galois operation, and hence the timings for the clocks among the flip-flop circuits are difficult to be secured.

In contrast, according to the error correction processing circuit 100, for example, as in the operator 500 illustrated in FIG. 5A, the parallel operation processing may be realized without the multistep processing operation for the Galois operation. Consequently, the timings for the clocks among the flip-flop circuits 54#1 to 54#16 may be easily secured, and the FEC operation is enabled even at a higher rate.

Moreover, according to the error correction processing circuit 100, since the data is divided into circuits of blocks for the FEC encoding, the multiple operation circuits may be realized with the basic circuit for each block for the FEC encoding, for example, such as the operator 500 illustrated in FIG. 5A. Thereby, the number of processes in parallel may be changed with addition or reduction of the basic circuit, such as the operator 500, to easily adapt to any change in the rate, for example. Moreover, common circuits independent of the rate, such as the operator 500, may be used for the multiple operation circuits. Consequently, the circuits may be commonized, and thereby easily designed and verified.

Embodiment 2

Configuration of Error Correction Processing Circuit According to Embodiment 2

FIG. 8 is a diagram illustrating a configuration example of the error correction processing circuit according to Embodiment 2. In FIG. 8, portions similar to those illustrated in FIG. 1 are assigned the same reference numerals and will not be described. Data having a width of 4×16=64 [bytes] is assumed to be inputted into the error correction processing circuit 100 according to Embodiment 2. The input data accumulation buffer 110 divides and stores the input data into four buffers, and outputs the data in each buffer to the divided input processing circuit 120.

The divided input processing circuit 120 multiplexes the data at a ratio of 4:1. The divided input processing circuit 120 outputs the multiplexed data to the operation processing circuit 130. The operation processing circuit 130 includes operators 131 to 134 provided in parallel. The operator 134 is an operator similar to the operators 131 to 133. The divided output processing circuit 140 parallelizes the data outputted from the operation processing circuit 130, at a ratio of 1:4. The divided output processing circuit 140 outputs the parallelized data to the output data accumulation buffer 150.

(Writing Input Data into Input Data Accumulation Buffer)

Figure 9A:
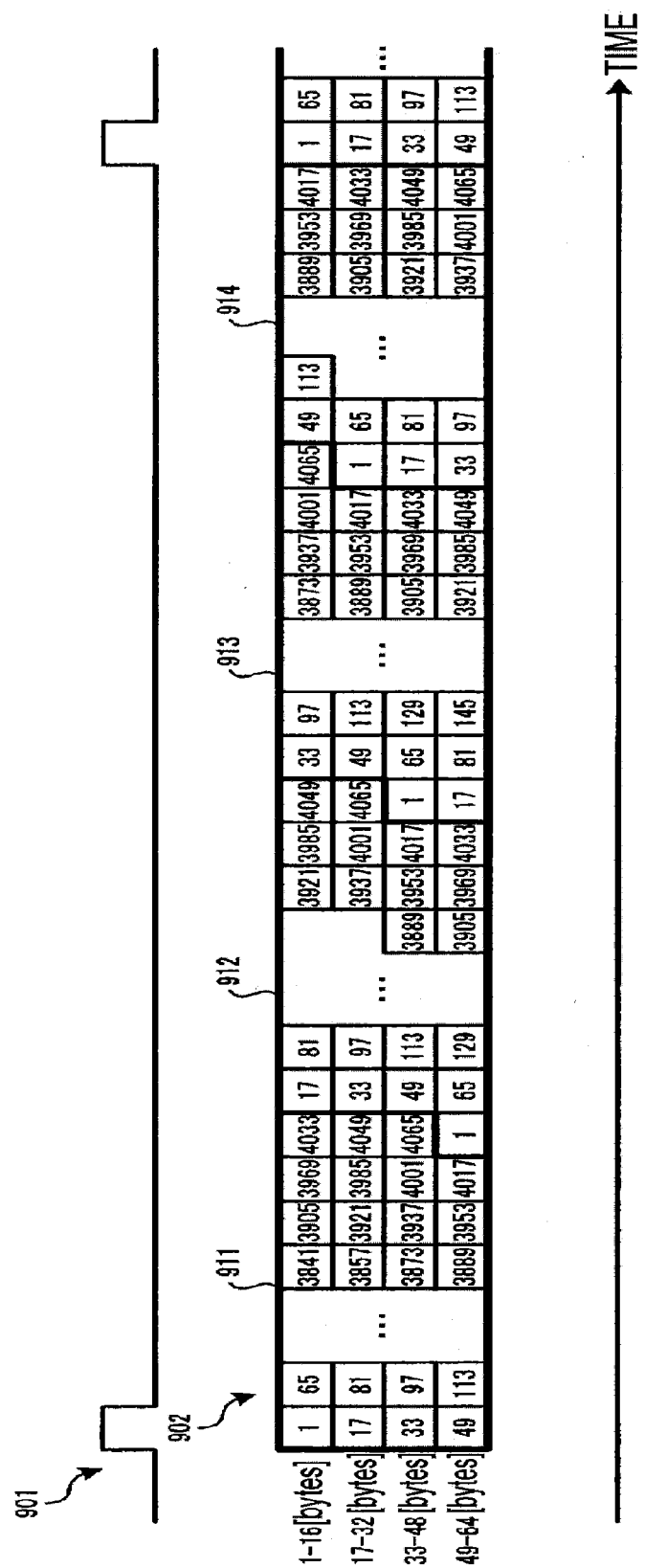
FIG. 9A is a diagram illustrating an example of the input data.

FIG. 9A is a diagram illustrating an example of the input data. Frame pulses 901 and input data 902 illustrated in FIG. 9A are examples of the frame pulses and the input data to be inputted into the error correction processing circuit 100 illustrated in FIG. 8, respectively. The input data 902 has a data width of 64 [bytes]. Each box in the input data 902 denotes data of 16 [bytes]. As illustrated in FIG. 9A, one frame of the input data 902 is divided into four SubFrames corresponding to the operators 131 to 134.

For example, the input data 902 includes SubFrames 911 to 914 in a first frame illustrated in FIG. 9A. Each of the SubFrames 911 to 914 is a SubFrame of 4080 [bytes] per row. As illustrated in FIG. 9A, for example, if the input data has a width of 16×(a power of 2) [bytes], the overlap may occur at the boundaries among the SubFrame circuits.

FIG. 9B is a diagram illustrating an example of writing the input data into the input data accumulation buffer. In FIG. 9B, four memories (buffers) in the input data accumulation buffer 110 are denoted as #0 to #3. A write address 921 and write enable 931 illustrated in FIG. 9B are a write address and a write instruction signal for the memory #0. The memory control circuit 461 sets the write address 921 and the write enable 931 such that the SubFrame 911 is written into the memory #0.

A write address 922 and write enable 932 are a write address and a write signal for the memory #1. The memory control circuit 461 sets the write address 922 and the write enable 932 such that the SubFrame 912 is written into the memory #1. A write address 923 and write enable 933 are a write address and a write signal for the memory #2. The memory control circuit 461 sets the write address 923 and the write enable 933 such that the SubFrame 913 is written into the memory #2. A write address 924 and write enable 934 are a write address and a write signal for the memory #3. The memory control circuit 461 sets the write address 924 and the write enable 934 such that the SubFrame 914 is written into the memory #3.

In the examples illustrated in FIGS. 9A and 9B, the overlap among the SubFrames occurs in the columns at the boundaries among the SubFrame circuits. Accordingly, the rows at the beginnings of the respective SubFrames are not aligned, and write cycles (the write enables 931 to 934) for the memories #0 to #3 are not aligned. For example, the rows at the beginnings of the SubFrames 911 to 914 are 1 to 4, respectively. Moreover, the write enable 931 temporally overlaps the write enable 932, the write enable 932 temporally overlaps the write enable 933, and the write enable 933 temporally overlaps the write enable 934.

If the input data 902 is divided into the respective Sub-Frames and written into the memories #0 to #3, for example, respective control circuits are provided for the memories #0 to #3. This complicates the circuit. In contrast, a function of adjusting code boundaries (for example, see FIG. 10) may be provided in the input data accumulation buffer 110 to align the beginnings of codes and then write the data into the memories #0 to #3. This may simplify the circuit.

(Specific Configuration Example of Error Correction Processing Circuit)

Figure 10:
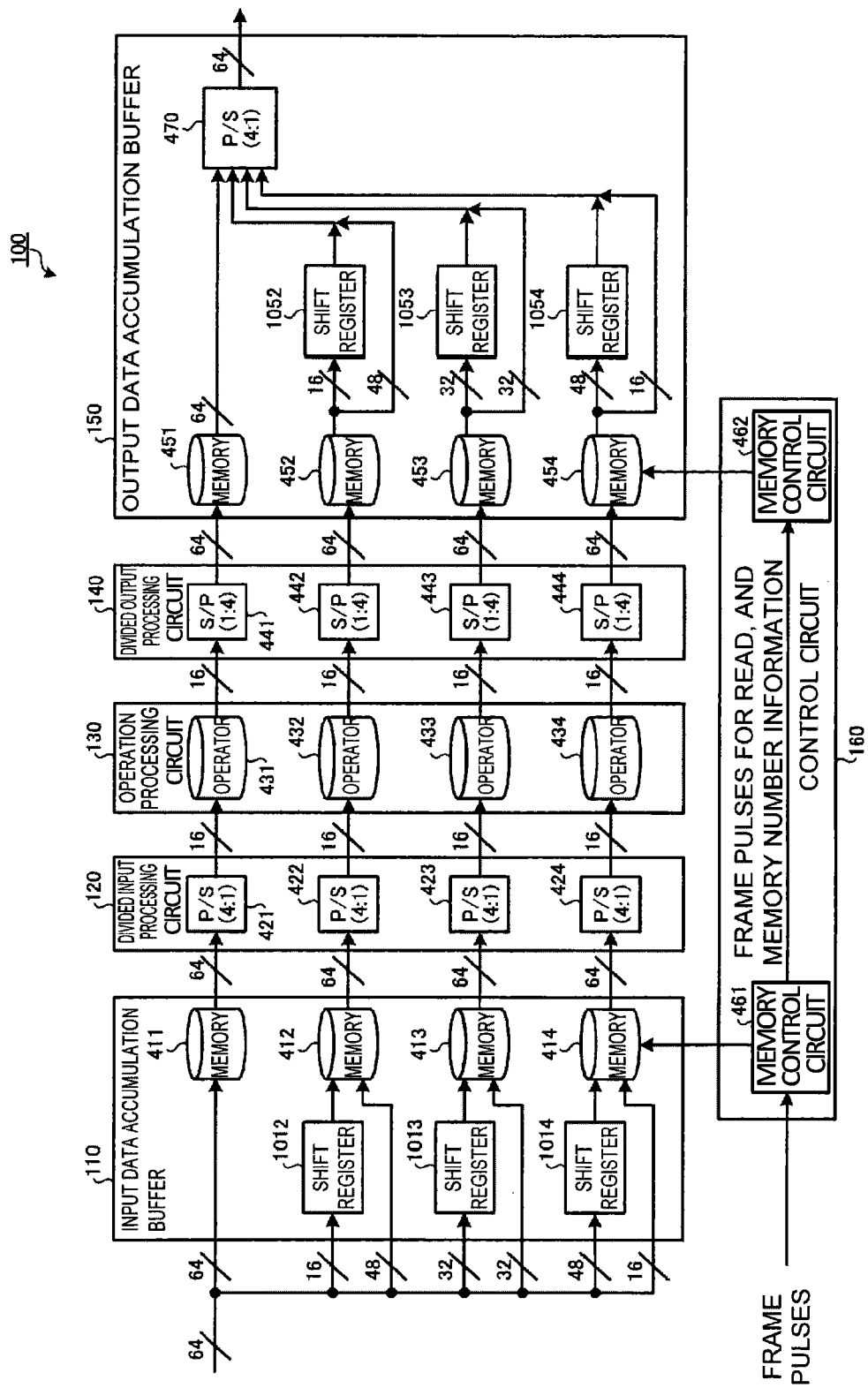
FIG. 10 is a diagram illustrating a specific configuration example of the error correction processing circuit.

FIG. 10 is a diagram illustrating a specific configuration example of the error correction processing circuit. In FIG. 10, portions similar to those illustrated in FIG. 4 are assigned the same reference numerals and will not be described. As illustrated in FIG. 10, the data having the width of 4×16=64 [bytes] is assumed to be inputted into the error correction processing circuit 100. The input data accumulation buffer 110 includes shift registers 1012 to 1014, and memories 411 to 414 as buffers. The divided input processing circuit 120 includes parallel/serial conversion circuits 421 to 424.

The operation processing circuit 130 includes operators 431 to 434. The divided output processing circuit 140 includes serial/parallel conversion circuits 441 to 444. The output data accumulation buffer 150 includes memories 451 to 454 as buffers, shift registers 1052 to 1054, and the parallel/serial conversion circuit 470. The control circuit 160 includes the memory control circuit 461 and the memory control circuit 462.

The shift registers 1012 to 1014 function as an alignment circuit that aligns boundaries among pieces of divided data. Data having a width of low order 16 [bytes], in the data having the width of 64 [bytes] inputted into the error correction processing circuit 100, is inputted into the shift register 1012. The shift register 1012 shifts the input data having the width of low order 16 [bytes] by one stage, and outputs the shifted data to the memory 412. Data having a width of high order 48 [bytes], in the data having the width of 64 [bytes] inputted into the error correction processing circuit 100, and the data having the width of 16 [bytes] outputted from the shift register 1012 are inputted into the memory 412.

Data having a width of low order 32 [bytes], in the data having the width of 64 [bytes] inputted into the error correction processing circuit 100, is inputted into the shift register 1013. The shift register 1013 shifts the input data having the width of low order 32 [bytes] by one stage, and outputs the shifted data to the memory 413. Data having a width of high order 32 [bytes], in the data having the width of 64 [bytes] inputted into the error correction processing circuit 100, and the data having the width of 32 [bytes] outputted from the shift register 1013 are inputted into the memory 413.

Data having a width of low order 48 [bytes], in the data having the width of 64 [bytes] inputted into the error correction processing circuit 100, is inputted into the shift register 1014. The shift register 1014 shifts the input data having the width of low order 48 [bytes] by one stage, and outputs the shifted data to the memory 414. Data having a width of high order 16 [bytes], in the data having the width of 64 [bytes] inputted into the error correction processing circuit 100, and the data having the width of 48 [bytes] outputted from the shift register 1014 are inputted into the memory 414.

The memory control circuit 461 in the control circuit 160 controls the memories 411 to 414 based on the inputted frame pulses. The memory control circuit 461 also outputs read instruction signals to the memories 411 to 414, respectively, to output the data written into the memories 411 to 414, to the parallel/serial conversion circuits 421 to 424, respectively.

The parallel/serial conversion circuits 421 to 424 multiplex the data having the width of 64 [bytes] outputted from the memories 411 to 414, respectively, at the ratio of 4:1, to convert the data into data having the width of 16 [bytes]. The parallel/serial conversion circuits 421 to 424 output the converted data having the width of 16 [bytes] to the operators 431 to 434, respectively.

The operators 431 to 434 are components corresponding to the operators 131 to 134 illustrated in FIG. 8, respectively. The operators 431 to 434 encode the data having the width of 16 [bytes] outputted from the parallel/serial conversion circuits 421 to 424, respectively, in 16 parallel processes. The operators 431 to 434 output the encoded data having the width of 16 [bytes] to the serial/parallel conversion circuits 441 to 444, respectively.

The serial/parallel conversion circuits 441 to 444 parallelize the data having the width of 16 [bytes] outputted from the operators 431 to 434, respectively, at the ratio of 1:4, to convert the data into data having the width of 64 [bytes]. The serial/parallel conversion circuits 441 to 444 output the converted data having the width of 64 [bytes] to the memories 451 to 454, respectively.

The memories 451 to 454 store the data outputted from the serial/parallel conversion circuits 441 to 444, in periods indicated by the memory control circuit 462, respectively. The memories 451 to 454 also output the stored data having the width of 64 [bytes], in periods indicated by the memory control circuit 462, respectively. The data having the width of 64 [bytes] outputted from the memory 451 is outputted to the parallel/serial conversion circuit 470.

Data having the width of low order 16 [bytes], in the data having the width of 64 [bytes] outputted from the memory 452, is outputted to the shift register 1052. The shift register 1052 shifts the data having the width of low order 16 [bytes] outputted from the memory 452, by one stage, and outputs the shifted data. Data having the width of high order 48 [bytes], in the data having the width of 64 [bytes] outputted from the memory 452, and the data having the width of 16 [bytes] outputted from the shift register 1052 are outputted as data having the width of 64 [bytes] to the parallel/serial conversion circuit 470.

Data having the width of low order 32 [bytes], in the data having the width of 64 [bytes] outputted from the memory 453, is outputted to the shift register 1053. The shift register 1053 shifts the data having the width of low order 32 [bytes] outputted from the memory 453, by one stage, and outputs the shifted data. Data having the width of high order 32 [bytes], in the data having the width of 64 [bytes] outputted from the memory 453, and the data having the width of 32 [bytes] outputted from the shift register 1053 are outputted as data having the width of 64 [bytes] to the parallel/serial conversion circuit 470.

Data having the width of low order 48 [bytes], in the data having the width of 64 [bytes] outputted from the memory 454, is outputted to the shift register 1054. The shift register 1054 shifts the data having the width of low order 48 [bytes] outputted from the memory 454, by one stage, and outputs the shifted data. Data having the width of high order 16 [bytes], in the data having the width of 64 [bytes] outputted from the memory 454, and the data having the width of 48 [bytes] outputted from the shift register 1054 are outputted as data having the width of 64 [bytes] to the parallel/serial conversion circuit 470.

In this way, the shift registers 1052 to 1054 function as a conversion circuit that converts sequences of the pieces of data for which the operations have been performed by the operators 431 to 434, into sequences, in a state before the alignment performed by the shift registers 1012 to 1014.

The parallel/serial conversion circuit 470 multiplexes data having a width of 4×64 [bytes] outputted from the memories 451 to 454, at the ratio of 4:1, to convert the data into data having the width of 64 [bytes]. The parallel/serial conversion circuit 470 outputs the converted data having the width of 64 [bytes] to the stage subsequent to the error correction processing circuit 100.

In this way, the error correction processing circuit 100 converts the data having the width of 16×N [bytes] (N=4 in FIG. 10) into the data in the format of 16 [bytes] for the operators 431 to 434, in the divided input processing circuit 120. In this case, N operators 431 to 434 are used. The error correction processing circuit 100 also converts the data of 16 [bytes] outputted from the operators 431 to 434, into the data having the width of 16×N [bytes], in the divided output processing circuit 140. According to the error correction processing circuit 100, even input data at a high bit rate (for example, 40 [G] or 100 [G]) may be processed with an increased number of processes in parallel N.

As illustrated in FIG. 10, the error correction processing circuit 100 writes the pieces of data having the beginnings aligned by the shift registers 1012 to 1014, into the memories 411 to 414. Then, the error correction processing circuit 100 FEC-encodes the pieces of data read from the memories 411 to 414, respectively in the operators 431 to 434. The pieces of data having the aligned beginnings may thereby be processed in the operators 431 to 434.

The error correction processing circuit 100, however, is not limited to such a configuration. For example, the shift registers 1012 to 1014 may be provided in stages subsequent to the memories 412 to 414, and the pieces of divided data may be written into the memories 411 to 414. Then, the error correction processing circuit 100 aligns the boundaries of the pieces of data read from the memories 411 to 414, in the shift registers 1012 to 1014. The pieces of data having the aligned beginnings may thereby be processed in the operators 431 to 434.

(Writing Input Data into Input Data Accumulation Buffer)

Figure 11:
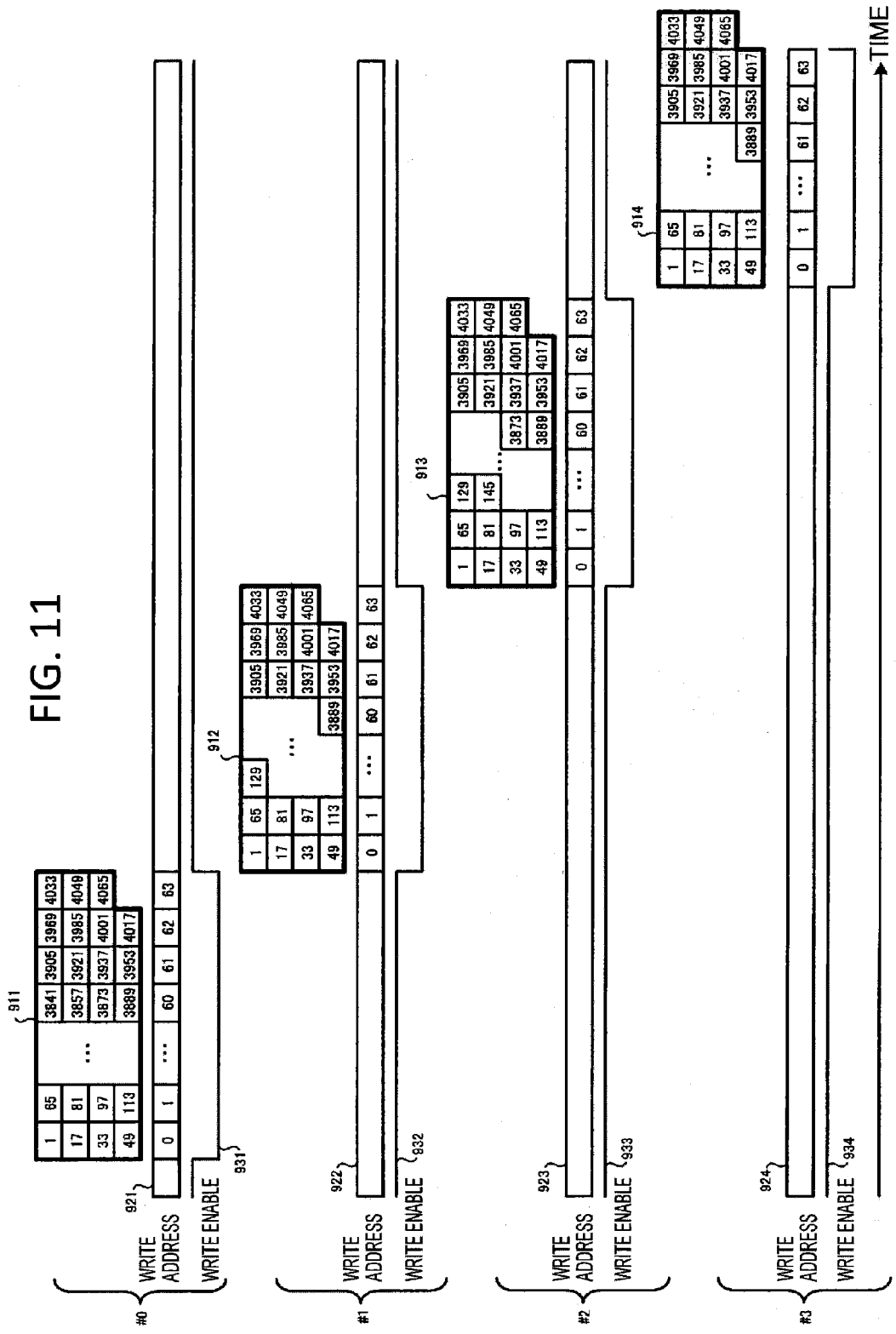
FIG. 11 is a diagram illustrating an example of writing the input data into the input data accumulation buffer.

FIG. 11 is a diagram illustrating an example of writing the input data into the input data accumulation buffer. In FIG. 11, portions similar to those illustrated in FIG. 9B are assigned the same reference numerals and will not be described. The low order 16 [bytes] in the SubFrame 912 written into the memory 412 (#1) have been shifted by one stage by the shift register 1012. The low order 32 [bytes] in the SubFrame 913 written into the memory 413 (#2) have been shifted by one stage by the shift register 1013. The low order 48 [bytes] in the SubFrame 914 written into the memory 414 (#3) have been shifted by one stage by the shift register 1014.

In the example illustrated in FIG. 11, no overlap among the SubFrames occurs in the columns at the boundaries among the SubFrame circuits. Accordingly, the rows at the beginnings of the respective SubFrames are aligned, and the write cycles (the write enables 931 to 934) for the memories 411 to 414 are aligned. For example, all the rows at the beginnings of the SubFrames 911 to 914 are 1. In addition, the SubFrames 911 to 914 do not temporally overlap one another.

Consequently, the input data 902 may be divided into the SubFrames and the respective SubFrames may be written into the memories 411 to 414, for example, without the respective control circuits provided for the memories 411 to 414. This may simplify the circuit. Moreover, since the beginnings of the pieces of data to be processed in the operators 431 to 434 have been aligned, the operators 431 to 434 do not need a configuration for absorbing a variation in the beginnings of the pieces of the data. This may also simplify the circuit.

In this way, according to the error correction processing circuit 100 of Embodiment 2, the boundaries of the pieces of divided data may be aligned, and the pieces of data having the aligned boundaries may be FEC-encoded (the operations of the error correction may be performed for the pieces of data having the aligned boundaries), respectively. Consequently, an advantageous effect similar to that provided by the error correction processing circuit 100 according to Embodiment 1 may be provided. Moreover, such a simple configuration enables the FEC encoding even with the overlap among the divided SubFrames.

Embodiment 3

In Embodiments 1 and 2, the case of the application of the error correction processing circuit 100 to the FEC encoder 212 has been described. The error correction processing circuit 100, however, may be applied to the FEC decoder 224. In the application of the error correction processing circuit 100 to the FEC decoder 224, the operators 131 to 134 (the operators 431 to 434) in the error correction processing circuit 100 are used as operators in the FEC decoder.

Figure 12:
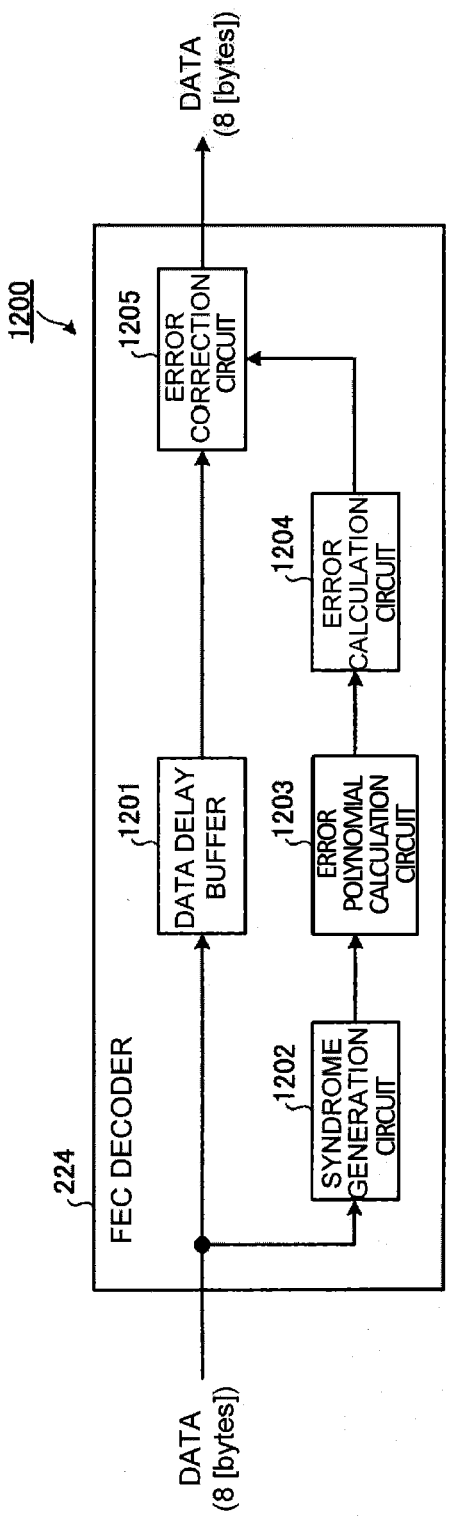
FIG. 12 is a diagram illustrating a configuration example of an operator in an FEC decoder.

FIG. 12 is a diagram illustrating a configuration example of the operator in the FEC decoder. An operator 1200 illustrated in FIG. 12 is the operator in the FEC decoder, and is applicable to the operators 131 to 134 (the operators 431 to 434) in the error correction processing circuit 100. As illustrated in FIG. 12, the operator 1200 includes a data delay buffer 1201, a syndrome generation circuit 1202, an error polynomial calculation circuit 1203, an error calculation circuit 1204, and an error correction circuit 1205.

For example, data having a width of 8 [bytes] is inputted into the FEC decoder 224. The data inputted into the FEC decoder 224 is inputted into the data delay buffer 1201 and the syndrome generation circuit 1202.

The data delay buffer 1201 delays the input data by a time requested for an error correction operation performed by the syndrome generation circuit 1202, the error polynomial calculation circuit 1203 and the error calculation circuit 1204. The data delay buffer 1201 outputs the delayed data to the error correction circuit 1205.

The syndrome generation circuit 1202 performs syndrome calculation for the input data and generates a syndrome value. The syndrome calculation performed by the syndrome generation circuit 1202 is, for example, syndrome calculation based on the RS (255, 239). The syndrome generation circuit 1202 outputs the generated syndrome value to the error polynomial calculation circuit 1203.

The error polynomial calculation circuit 1203 derives an error locator polynomial and an error value polynomial based on the syndrome value outputted from the syndrome generation circuit 1202. For example, the Euclidean method or the like may be used to derive the error locator polynomial and the error value polynomial. The error polynomial calculation circuit 1203 outputs the error locator polynomial and the error value polynomial that have been derived, to the error calculation circuit 1204.

The error calculation circuit 1204 derives an error location and an error value in the data inputted into the FEC decoder 224, based on the error locator polynomial and the error value polynomial that have been outputted from the error polynomial calculation circuit 1203. For example, the Chien search method or the like may be used to derive the error location and the error value. The error calculation circuit 1204 outputs the error location and the error value that have been derived, to the error correction circuit 1205.

The error correction circuit 1205 corrects the data outputted from the data delay buffer 1201, based on the error location and the error value that have been outputted from the error calculation circuit 1204. The error correction circuit 1205 outputs the corrected data to a stage subsequent to the FEC decoder 224.

In this way, according to the error correction processing circuit 100 of Embodiment 3, the target data may be divided into circuits of the error correction operation, and the respective pieces of divided data may be decoded for the error correction by the multiple operation circuits in parallel. The higher capacity communication may be thereby achievable, similarly to the error correction processing circuit 100 according to Embodiment 1.

As described above, according to the error correction processing circuit and the error correction processing method, the higher capacity communication may be achievable.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An error correction processing circuit, comprising:
   a division circuit that divides input data into a plurality of pieces of a predetermined data length;
   a serial conversion circuit that converts the plurality of pieces of data divided by the division circuit into a plurality of pieces of serial data;
   a plurality of encoders that are provided in parallel, and that perform encoding for the plurality of pieces of serial data converted by the serial conversion circuit, respectively;
   a parallel conversion circuit that converts the plurality of pieces of data for which the encoding has been performed by the plurality of encoders, into a plurality of pieces of parallel data such that each of the pieces of parallel data corresponds to a bus width in a state before the serial conversion performed by the serial conversion circuit;
   a multiplexing circuit that multiplexes the plurality of pieces of parallel data provided in the conversion performed by the parallel conversion circuit;
   an output circuit that outputs the data multiplexed by the multiplexing circuit; and
   a control circuit configured to receive frame pulses that indicate beginnings of frames of the input data inputted into the division circuit and to control writing and reading data into/from the division circuit and writing and reading data into/from the multiplexing circuit based on the frame pulses.

2. The error correction processing circuit according to claim 1, further comprising:
   an alignment circuit that aligns boundaries among the plurality of pieces of data, wherein
   the plurality of encoders perform the encoding for the plurality of pieces of data having the boundaries aligned by the alignment circuit, respectively.

3. The error correction processing circuit according to claim 2, further comprising:
   a plurality of memories into which the plurality of pieces of data having the boundaries aligned by the alignment circuit are written, respectively, wherein
   the plurality of encoders perform the encoding for the plurality of pieces of data read from the plurality of memories, respectively.

4. The error correction processing circuit according to claim 2, further comprising:
   a plurality of memories into which the plurality of pieces of data divided by the division circuit are written, respectively, wherein
   the alignment circuit aligns the boundaries among the plurality of pieces of data read from the plurality of memories.

5. The error correction processing circuit according to claim 2, further comprising:
   a conversion circuit that converts the plurality of pieces of data for which the encoding has been performed by the plurality of encoders, into sequences in a state before the alignment performed by the alignment circuit, wherein
   the multiplexing circuit multiplexes the plurality of pieces of data in the sequences converted by the conversion circuit.

6. An error correction processing method, comprising:
   dividing, by a division circuit, input data into a plurality of pieces of a predetermined data length;
   converting the plurality of pieces of data into a plurality of pieces of serial data, encoding the plurality of pieces of serial data converted by the converting, respectively, by a plurality of encoders provided in parallel;
   converting the plurality of pieces of data for which the encoding has been performed by the plurality of encoders, into a plurality of pieces of parallel data such that each of the pieces of parallel data corresponds to a bus width in a state before the serial conversion;
   multiplexing, by a multiplexing circuit, the plurality of pieces of parallel data provided in the conversion performed by the parallel conversion;
   outputting the multiplexed data;
   receiving frame pulses that indicate beginnings of frames of the input data inputted into the division circuit and controlling writing and reading data into/from the division circuit and writing and reading data into/from the multiplexing circuit based on the frame pulses.

* * * * *